(12) United States Patent
Ishibashi et al.

(10) Patent No.: US 10,217,607 B2
(45) Date of Patent: Feb. 26, 2019

(54) ION IMPLANTATION APPARATUS AND ION IMPLANTATION METHOD

(71) Applicant: SUMITOMO HEAVY INDUSTRIES ION TECHNOLOGY CO., LTD., Tokyo (JP)

(72) Inventors: Kazuhisa Ishibashi, Ehime (JP); Shiro Ninomiya, Ehime (JP); Akihiro Ochi, Ehime (JP); Toshio Yumiyama, Ehime (JP)

(73) Assignee: SUMITOMO HEAVY INDUSTRIES ION TECHNOLOGY CO., LTD., Tokyo (JP)

( * ) Notice: Subject to any disclaimer, the term of this patent is extended or adjusted under 35 U.S.C. 154(b) by 0 days.

(21) Appl. No.: 15/695,857

(22) Filed: Sep. 5, 2017

(65) Prior Publication Data
US 2018/0068829 A1  Mar. 8, 2018

(30) Foreign Application Priority Data
Sep. 6, 2016  (JP) .................. 2016-173935

(51) Int. Cl.
*H01J 37/30* (2006.01)
*H01J 37/304* (2006.01)
(Continued)

(52) U.S. Cl.
CPC ........ *H01J 37/304* (2013.01); *H01J 37/3002* (2013.01); *H01J 37/3171* (2013.01);
(Continued)

(58) Field of Classification Search
CPC .. H01J 37/304; H01J 37/3002; H01J 37/3171; H01J 2237/24514;
(Continued)

(56) References Cited

U.S. PATENT DOCUMENTS 7,365,406 B2  4/2008  Rouh et al.
8,343,859 B2  1/2013  Rouh et al.
(Continued)

FOREIGN PATENT DOCUMENTS

JP  H11-233450 A   8/1999
JP  2006-313732 A  11/2006
(Continued)

*Primary Examiner* — David E Smith
(74) *Attorney, Agent, or Firm* — Michael Best & Friedrich LLP

(57) ABSTRACT

An ion implantation apparatus includes a beam scanner that provides a reciprocating beam scan in a beam scan direction in accordance with a scan waveform, a mechanical scanner that causes a wafer to reciprocate in a mechanical scan direction, and a control device that controls the beam scanner and the mechanical scanner to realize a target two-dimensional dose amount distribution on a surface of the wafer. The control device includes a scan frequency adjusting unit that determines a frequency of the scan waveform in accordance with the target two-dimensional dose amount distribution, and a beam scanner driving unit that drives the beam scanner by using the scan waveform having the frequency determined by the scan frequency adjusting unit.

19 Claims, 15 Drawing Sheets

(51) Int. Cl.
 *H01J 37/317* (2006.01)
 *H01L 21/265* (2006.01)
(52) U.S. Cl.
 CPC .. *H01L 21/265* (2013.01); *H01J 2237/24514* (2013.01); *H01J 2237/30455* (2013.01); *H01J 2237/30477* (2013.01); *H01J 2237/30488* (2013.01); *H01J 2237/31701* (2013.01)
(58) Field of Classification Search
 CPC ... H01J 2237/30455; H01J 2237/30477; H01J 2237/30488; H01J 2237/31701; H01L 21/265
 See application file for complete search history.

(56) References Cited

U.S. PATENT DOCUMENTS

| | | | | |
|---|---|---|---|---|
| 8,368,036 | B2* | 2/2013 | Hino | H01J 37/1472 250/492.21 |
| 8,735,181 | B2 | 5/2014 | Fujii et al. | |
| 8,772,142 | B2* | 7/2014 | Ninomiya | C23C 14/48 250/492.21 |
| 8,772,741 | B2 | 7/2014 | Ninomiya et al. | |
| 9,165,772 | B2 | 10/2015 | Ninomiya et al. | |
| 9,305,784 | B2 | 4/2016 | Ninomiya et al. | |
| 9,601,314 | B2 | 3/2017 | Ninomiya et al. | |
| 9,646,837 | B2 | 5/2017 | Ninomiya et al. | |
| 2007/0221872 | A1* | 9/2007 | Olson | H01J 37/026 250/492.21 |
| 2008/0302955 | A1* | 12/2008 | Dzengeleski | H01J 37/1477 250/252.1 |
| 2011/0297842 | A1* | 12/2011 | Ninomiya | H01J 37/304 250/396 ML |
| 2012/0322248 | A1* | 12/2012 | Ninomiya | H01J 37/3171 438/514 |
| 2013/0068960 | A1* | 3/2013 | Chang | H01J 37/3171 250/394 |
| 2017/0148633 | A1 | 5/2017 | Ninomiya et al. | |

FOREIGN PATENT DOCUMENTS

| | | |
|---|---|---|
| JP | 2009-099857 A | 5/2009 |
| JP | 2012-204006 A | 10/2012 |
| JP | 2012-204327 A | 10/2012 |
| JP | 2013-004610 A | 1/2013 |
| JP | 2013-127940 A | 6/2013 |
| JP | 5311112 B2 | 7/2013 |
| JP | 2013-157373 A | 8/2013 |
| JP | 2014-022347 A | 2/2014 |

\* cited by examiner

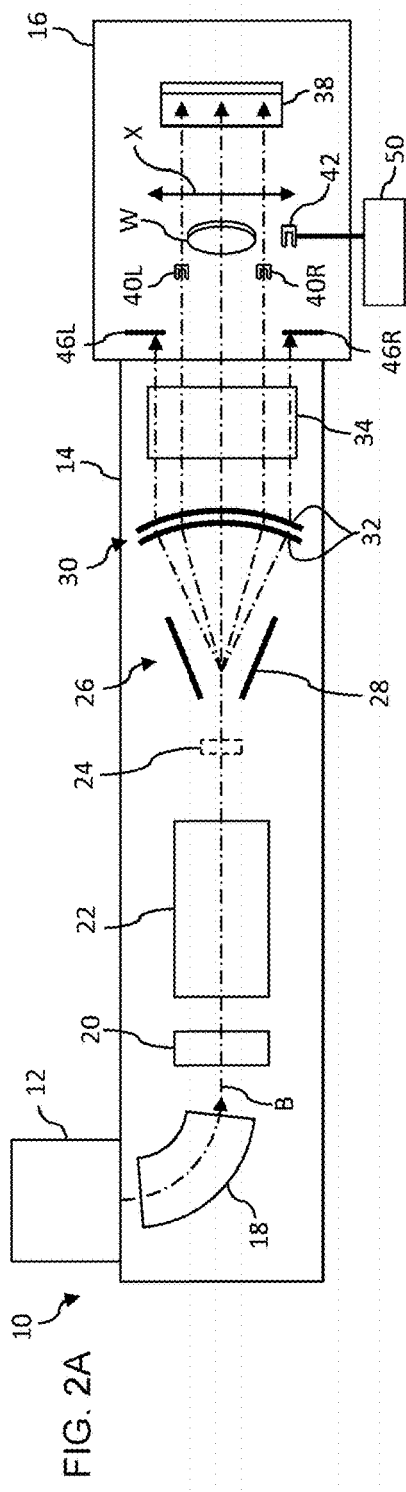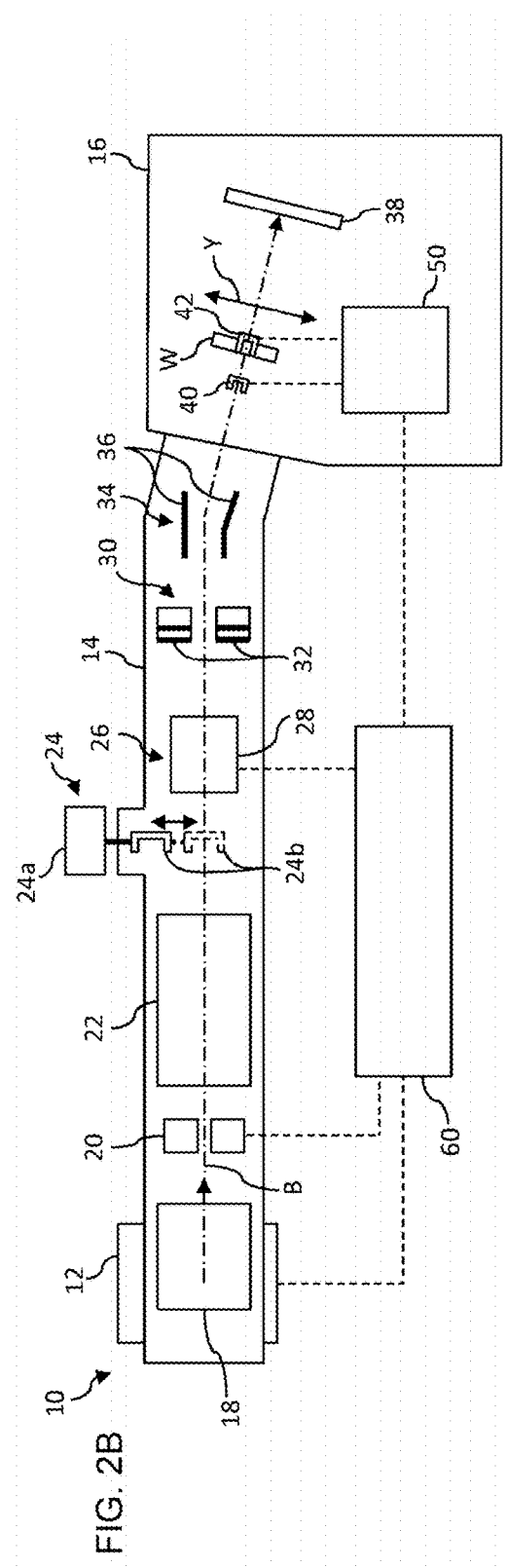

ION IMPLANTATION APPARATUS AND ION IMPLANTATION METHOD

RELATED APPLICATIONS

Priority is claimed to Japanese Patent Application No. 2016-173935, filed Sep. 6, 2016, the entire content of which is incorporated herein by reference.

BACKGROUND

Technical Field

A certain embodiment of the invention relates to an ion implantation apparatus and an ion implantation method.

Description of Related Art

In a semiconductor manufacturing process, a process of implanting ions into a semiconductor wafer is performed in order to change conductivity, change the crystal structure of the semiconductor wafer, and the like. An apparatus used in this process is generally referred to as an ion implantation apparatus. Generally, realization of a uniform two-dimensional ion implantation amount distribution in the wafer plane is required. A non-uniform two-dimensional ion implantation amount distribution may also be intentionally desired. In order to realize non-uniform implantation, the beam scan speed of an ion beam and the mechanical scan speed of the wafer are controlled to be changed per implantation region. For example, the scan speeds are controlled to be decreased in a high dose ion implantation region, and the scan speeds are controlled to be increased in a low dose ion implantation region.

SUMMARY

According to an aspect of an embodiment of the invention, there is provided an ion implantation apparatus including a beam scanner that provides a reciprocating beam scan in a beam scan direction in accordance with a scan waveform, a mechanical scanner that causes a wafer to reciprocate in a mechanical scan direction, and a control device that controls the beam scanner and the mechanical scanner to realize a target two-dimensional dose amount distribution on a surface of the wafer. The control device includes a scan frequency adjusting unit that determines a frequency of the scan waveform in accordance with the target two-dimensional dose amount distribution, and a beam scanner driving unit that drives the beam scanner by using the scan waveform having the frequency determined by the scan frequency adjusting unit.

According to another aspect of the embodiment of the invention, there is provided an ion implantation method using an ion implantation apparatus. The ion implantation apparatus includes a beam scanner that provides a reciprocating beam scan in a beam scan direction in accordance with a scan waveform, and a mechanical scanner that causes a wafer to reciprocate in a mechanical scan direction. The method includes determining a frequency of the scan waveform in accordance with a target two-dimensional dose amount distribution that is to be realized on a surface of the wafer, and driving the beam scanner in accordance with the scan waveform having the determined frequency.

BRIEF DESCRIPTION OF THE DRAWINGS

FIG. 2A is a top view illustrating a schematic configuration of an ion implantation apparatus according to an embodiment, and FIG. 2B is a side view illustrating a schematic configuration of the ion implantation apparatus according to the embodiment.

DETAILED DESCRIPTION

Figure 1A:
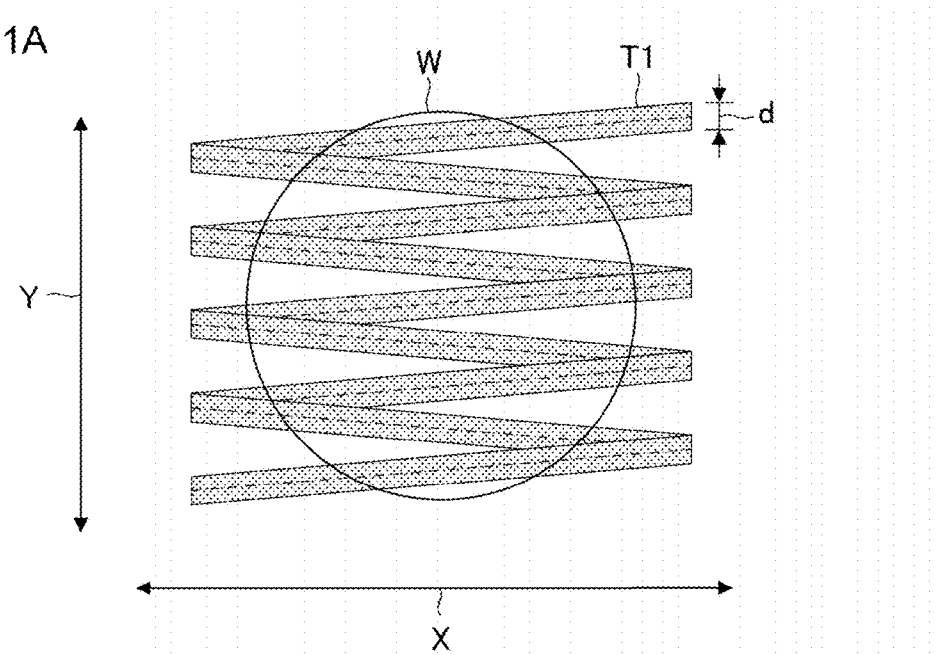
FIG. 1A and FIG. 1B schematically illustrate a relationship between a scan frequency and uneven implantation resulting from a hybrid scan implantation process.

A beam scan frequency is one of important control parameters in a hybrid scan ion implantation apparatus that combines a beam scan with a mechanical scan. If the beam scan frequency is changed, the amount of damage induced to a wafer by ion beam irradiation may be changed, or a significant difference from a target ion implantation amount distribution may be generated. If the scan frequency is constantly fixed by considering influence of a change in scan frequency, a target implantation amount difference may not be realized in the wafer plane due to a constraint such as the maximum realizable scan speed of a beam scanner.

It is desirable to provide a technology that realizes a target non-uniform two-dimensional ion implantation amount distribution by considering influence of a change in scan frequency.

Any combination of the constituents or substitution of the constituents or representations of an embodiment of the invention with each other among an apparatus, a method, a system, a computer program, a recording medium storing a computer program, and the like is also effective as an aspect of the embodiment of the invention.

A summary of an embodiment of the invention will be described before a detailed description of the embodiment. According to an aspect of an embodiment of the invention, there is provided an ion implantation apparatus including a beam scanner that provides a reciprocating beam scan in a beam scan direction in accordance with a scan waveform, a mechanical scanner that causes a wafer to reciprocate in a mechanical scan direction, and a control device that controls the beam scanner and the mechanical scanner to realize a target two-dimensional dose amount distribution on a surface of the wafer.

The control device realizes the target two-dimensional dose amount distribution on the wafer surface by changing a beam scan speed of an ion beam and a mechanical scan speed of the wafer per implantation region of the wafer. For example, the scan waveform is controlled in such a manner that the scan speed is low in a high dose implantation region and that the scan speed is high in a low dose implantation region. The present embodiment determines the frequency of the scan waveform in accordance with the target two-dimensional dose amount distribution and uses the scan waveform having the determined frequency. Accordingly, even in non-uniform implantation in which the ratio of in-plane dose amounts is highly set, a side effect due to a change in scan frequency is reduced, and target non-uniform implantation is precisely realized.

Hereinafter, influence occurring from a change in scan frequency will be described. The control device generates a scan waveform that enables the scan speed to be changed in accordance with the position of the wafer, and drives the beam scanner in accordance with the generated scan waveform. In the ion implantation apparatus, typically, a uniform dose amount distribution in the wafer plane is required. In this case, a beam current intensity distribution in the beam scan direction is measured, and the scan waveform is corrected based on the measurement. Correction of the scan waveform is repeated until the actual measured value of the beam current intensity distribution falls within a target range, thereby generating a scan waveform corresponding to a uniform beam current intensity distribution.

In the case of performing non-uniform implantation in which the in-plane dose amount has a non-uniform distribution, a scan waveform corresponding to a target non-uniform dose amount distribution is generated by performing a predetermined calculation process for the uniform implantation scan waveform. In this case, the scan waveform is typically calculated to have the same scan frequency as that for the uniform implantation scan waveform. The scan frequency corresponds to the cycle of time taken for one reciprocating beam scan in the beam scan direction. The same scan frequency means the same amount of time taken for the reciprocating scan. Accordingly, if the same scan frequency is used, the dose amount per unit time imparted to the wafer is constant, provided that the intensity of a beam current without a scan is constant. The dose amount per unit time is related to the amount of damage induced to the wafer. Thus, if the scan frequency is fixed, a uniform amount of damage to the wafer can be achieved. If the scan frequency is different per implantation region, variations occur in the amount of wafer damage induced per the implantation region and may not be desirable.

Figure 1B:
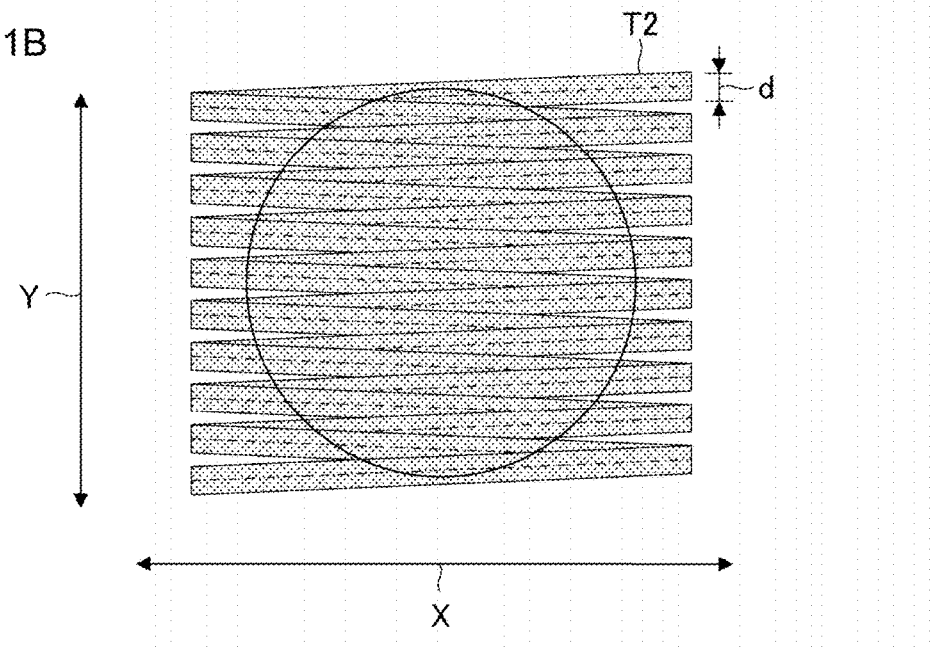

The scan frequency is also related to the implantation precision of the dose amount distribution realized on the wafer surface. FIG. 1A and FIG. 1B schematically illustrate a relationship between the scan frequency and uneven implantation resulting from a hybrid scan implantation process. FIG. 1A and FIG. 1B illustrate the trace of an ion beam on the wafer surface in the case of performing a mechanical scan of a wafer W in a Y direction and a beam scan for the wafer W in an X direction. FIG. 1A illustrates a trace T1 of the ion beam in the case of a relatively low beam scan frequency and illustrates the case where the distance of movement of the wafer W in the Y direction during one reciprocation of the ion beam is greater than or equal to twice a beam diameter d. FIG. 1B illustrates a trace T2 of the ion beam in the case of a relatively high beam scan frequency and illustrates the case where the distance of movement of the wafer W in the Y direction during one reciprocation of the ion beam is less than or equal to twice the beam diameter d. As illustrated in FIG. 1A and FIG. 1B, it is understood that the lower beam scan frequency has a greater interval between each scan and tends to cause uneven implantation. Accordingly, the beam scan frequency is preferably high to a certain extent in order to precisely realize a target dose amount distribution on the wafer surface by reducing uneven implantation.

From the above viewpoint, it is preferable that the scan frequency be highly set to a certain extent and that the scan frequency be constantly fixed, considering wafer damage and uneven implantation. From such a background, an ion implantation apparatus in the related art constantly uses a fixed scan frequency that is determined in advance by considering wafer damage and uneven implantation. However, non-uniform implantation having a high ratio of in-plane dose amounts may not be executed with the fixed scan frequency. Setting the ratio of in-plane dose amounts highly requires increasing a difference in beam scan speed per each implantation region, and the maximum scan speed required exceeds the upper limit of operation of the beam scanner depending on the circumstances. Accordingly, a required difference in beam scan speed is not acquired, and a required ratio of in-plane dose amounts cannot be realized. Consequently, a realizable ratio of in-plane dose amounts is constrained.

Therefore, the present embodiment determines the frequency of the scan waveform in accordance with the target two-dimensional dose amount distribution and uses the scan waveform having the determined frequency. In non-uniform implantation in which the ratio of in-plane dose amounts is highly set, an upper limit scan frequency is calculated as the frequency of the scan waveform in the case where the maximum change rate of the scan waveform for realization of the target two-dimensional dose amount distribution is adjusted to match the upper limit change rate of the beam scanner. In addition, the frequency of the scan waveform is determined in the range of greater than or equal to a lower limit scan frequency to less than or equal to the upper limit scan frequency by referencing the lower limit scan frequency that is determined by considering wafer damage and uneven implantation. Accordingly, even in non-uniform implantation in which the ratio of in-plane dose amounts is highly set, a side effect due to a change in scan frequency is reduced, and target non-uniform implantation is precisely realized.

Hereinafter, the embodiment will be described in detail with reference to the drawings. The same elements in description of the drawings are designated by the same reference signs and may not be described repeatedly. Configurations described below are for illustrative purposes and do not limit the scope of the embodiment of the invention.

FIG. 2A and FIG. 2B are diagrams schematically illustrating an ion implantation apparatus 10 according to the embodiment. FIG. 2A is a top view illustrating a schematic configuration of the ion implantation apparatus 10, and FIG. 2B is a side view illustrating a schematic configuration of the ion implantation apparatus 10.

The ion implantation apparatus 10 is configured to perform an ion implantation process on the surface of a processed object. The processed object is, for example, a substrate and is, for example, a semiconductor wafer. Thus, hereinafter, the processed object may be referred to as the wafer W for convenience of description. However, this does not intend to limit a target of the implantation process to a specific object.

The ion implantation apparatus 10 is configured to irradiate the entire wafer W with an ion beam B by at least one of reciprocating scanning of the beam and reciprocation of the wafer W. For convenience of description, the present specification defines a Z direction as the designed traveling direction of the ion beam B and defines an XY plane as a plane perpendicular to the Z direction. In the case of scanning the processed object W with the ion beam B, the X direction is defined as the beam scan direction, and the Y direction (hereinafter, referred to as the mechanical scan direction) is defined as a direction perpendicular to the Z direction and the X direction.

The ion implantation apparatus 10 includes an ion source 12, a beamline device 14, and an implantation processing chamber 16. The ion source 12 is configured to provide the ion beam B to the beamline device 14. The beamline device 14 is configured to transport ions to the implantation processing chamber 16 from the ion source 12. The ion implantation apparatus 10 also includes a vacuum exhaust system (not illustrated) that provides a desired vacuum environment in the ion source 12, the beamline device 14, and the implantation processing chamber 16.

As illustrated in FIG. 2A and FIG. 2B, the beamline device 14 includes, for example, in order from upstream, a mass analyzing unit 18, a variable aperture 20, a beam shaping unit 22, a first beam measuring unit 24, a beam scanner 26, a parallelizing lens 30 or a beam parallelizing device, and an angular energy filter (AEF) 34. The upstream of the beamline device 14 means to a side thereof near the ion source 12, and the downstream of the beamline device 14 means to aside thereof near the implantation processing chamber 16 (or a beam stopper 38).

The mass analyzing unit 18 is disposed downstream of the ion source 12 and is configured to select a required ion species by mass analysis from the ion beam B extracted from the ion source 12.

The variable aperture 20 is an aperture having an adjustable opening width and adjusts the intensity of a beam current of the ion beam B passing through the aperture by changing the opening width. The variable aperture 20 may have, for example, aperture plates arranged above and below the beam trajectory and may adjust the intensity of the beam current by changing the interval between the aperture plates.

The beam shaping unit 22 includes a focusing lens such as a quadrupole focusing device (Q lens) and is configured to shape the ion beam B passing the variable aperture 20 to have a desired cross-sectional shape.

The first beam measuring unit 24 is an injector flag Faraday cup that is arranged to be on and out of the beam trajectory and measures the current of the ion beam. The first beam measuring unit 24 has a Faraday cup 24b that measures the beam current, and a drive unit 24a that moves the Faraday cup 24b up and down. In the case of arranging the Faraday cup 24b on the beam trajectory as illustrated by a dashed line in FIG. 2B, the ion beam B is blocked by the Faraday cup 24b. In the case of removing the Faraday cup 24b out of the beam trajectory as illustrated by a solid line in FIG. 2B, the blocking of the ion beam B is released.

The beam scanner 26 is configured to provide a reciprocating beam scan in the beam scan direction in accordance with the scan waveform. The beam scanner 26 is a deflector that scans the shaped ion beam B in the X direction. The beam scanner 26 has scanner electrodes 28 that are disposed away from each other in the X direction. The scanner electrodes 28 are connected to a variable voltage power source (not illustrated). Changing a voltage applied to the scanner electrodes 28 changes an electric field generated between electrodes, thereby deflecting the ion beam B. Accordingly, the ion beam B is reciprocatingly scanned in the X direction. In FIG. 2A, an arrow X illustrates the reciprocating beam scan, and a plurality of trajectories of the ion beam B are illustrated by dot-dashed lines.

While the beam scanner 26 uses an electric field, a beam scanner using a magnetic field may also be used. Alternatively, a beam scanner using both an electric field and a magnetic field may also be used.

The parallelizing lens 30 is configured to parallelize the scanned ion beam B in the traveling direction thereof. The parallelizing lens 30 has an arc-shaped P lens electrode 32 in which a slit that the ion beam passes through is disposed in the central location. The P lens electrode 32 is connected to a high voltage power source (not illustrated) and applies an electric field generated by voltage application to the ion beam B, thereby parallelizing the ion beam B in the traveling direction thereof.

The angular energy filter 34 is configured to analyze the energy of the ion beam B and deflect ions having a required energy downward to guide the ions to the implantation processing chamber 16. The angular energy filter 34 has a magnet device (not illustrated) for magnetic field deflection or AEF electrodes 36 for electric field deflection or has both thereof. The AEF electrodes 36 are connected to a high voltage power source (not illustrated). In FIG. 2B, the ion beam B is deflected downward by applying a positive voltage to the upper AEF electrode 36 and a negative voltage to the lower AEF electrode 36.

The beamline device 14 includes a beamline configuration element that is disposed upstream or downstream of the beam scanner 26 and can adjust the beam width on the wafer surface in the beam scan direction.

The beamline device 14 supplies, to the implantation processing chamber 16, the ion beam B with which the wafer W is to be irradiated.

The implantation processing chamber 16 includes a mechanical scanner 44 (refer to FIG. 3) that is configured to hold one wafer W or a plurality thereof and, if necessary, provide relative movement (for example, in the Y direction) of the wafer W with respect to the ion beam B. In FIG. 2B, an arrow Y illustrates reciprocation of the wafer W. The implantation processing chamber 16 includes the beam stopper 38. In the case of absence of the wafer W on the beam trajectory, the ion beam B is incident onto the beam stopper 38.

A second beam measuring unit 50 is disposed in the implantation processing chamber 16. The second beam measuring unit 50 is configured to measure a beam current intensity distribution in the beam scan direction downstream of the beam scanner 26. The second beam measuring unit 50 has side cups 40R and 40L and a center cup 42.

The side cups 40R and 40L are arranged away from the wafer W in the X direction and are arranged in positions where the ion beam traveling toward the wafer W in ion implantation is not blocked. The ion beam B is overscanned beyond the range where the wafer W is positioned. Thus, a part of the scanned beam is incident onto the side cups 40R and 40L in ion implantation. The side cups 40R and 40L function as a beam current monitoring unit that monitors the intensity of the beam current during the ion implantation process. The measured values of the side cups 40R and 40L are sent to the second beam measuring unit 50.

The center cup 42 is a beam current measuring unit that measures the beam current intensity distribution on the surface of the wafer W. The center cup 42 is movable and thus, recedes from the position of the wafer in ion implantation and is put in the position of the wafer when the wafer W is not in an irradiated position. The center cup 42 measures the intensity of the beam current while moving in the X direction, thereby measuring the beam current intensity distribution in the beam scan direction. The measured value of the center cup 42 is sent to the second beam measuring unit 50. The center cup 42 may be formed to have an array shape in which a plurality of Faraday cups are lined up in the X direction, so that the intensity of the beam current can be measured in a plurality of positions in the beam scan direction at the same time.

The second beam measuring unit 50 can measure the beam current intensity distribution in the beam scan direction in the same position as the wafer surface in the Z direction. The second beam measuring unit 50 may be configured to measure the beam current intensity distribution in the beam scan direction in a position upstream of the wafer surface. Alternatively, as described below, the second beam measuring unit 50 may be configured to measure the beam current intensity distribution in the beam scan direction in a position downstream of the wafer surface.

Protective plates 46R and 46L are disposed in the implantation processing chamber 16. The protective plates 46R and 46L are arranged away from the wafer W in the X direction and are arranged in positions where the ion beam traveling toward the wafer W in ion implantation or the ion beam traveling toward the side cups 40R and 40L is not blocked. The protective plates 46R and 46L prevent the inner wall of the implantation processing chamber 16 or a device or the like disposed inside the implantation processing chamber 16 from being irradiated with the ion beam overscanned beyond the range where the wafer W is positioned. The protective plates 46R and 46L are made of graphite or the like. The protective plates 46R and 46L are preferably disposed downstream of the beam scanner 26 and may be disposed in the beamline device 14.

The control device 60 controls operation of each device constituting the ion implantation apparatus 10. For example, the control device 60 controls the beam scanner 26 and the mechanical scanner 44 to realize a desired target two-dimensional dose amount distribution on the wafer surface.

The control device 60 generates a beam scanner control signal that controls the beam scanner 26 to apply a scan electric field (or a scan magnetic field in the case of using a magnetic field) to the beam scanner 26 in accordance with the scan waveform (for example, scan waveforms illustrated in FIG. 8A and FIG. 8B), and outputs the beam scanner control signal to the beam scanner 26. The form of the beam scanner control signal is not limited, provided that the scan waveform is realized. The control device 60 generates a mechanical scanner control signal that controls the mechanical scanner 44 to cause the wafer W to reciprocate in appropriate synchronization with the reciprocating beam scan performed by the beam scanner 26, and outputs the mechanical scanner control signal to the mechanical scanner 44. The form of the mechanical scanner control signal is not limited, provided that a correct mechanical scan is realized.

Figure 3:
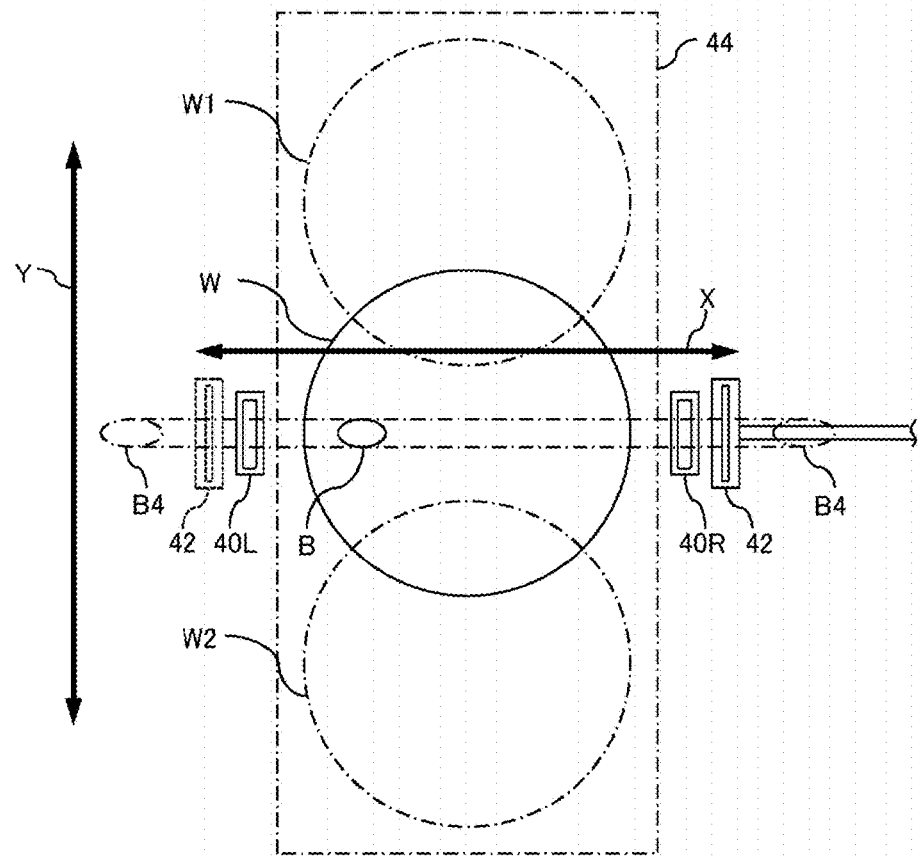
FIG. 3 is a front view illustrating a relationship between a reciprocating wafer and a reciprocatingly scanned beam.

FIG. 3 is a front view illustrating a relationship between the reciprocating wafer W and the reciprocatingly scanned ion beam B. In FIG. 3, the ion beam B is reciprocatingly scanned in the horizontal direction (X direction), and the wafer W being held in the mechanical scanner 44 reciprocates on the vertical direction (Y direction). Such a combination of a beam scan and a mechanical scan is referred to as a hybrid scan. In FIG. 3, the range of operation of the mechanical scanner 44 is illustrated by illustrating a wafer W1 in the uppermost position and a wafer W2 in the lowermost position.

The scannable range of the ion beam B scanned by the beam scanner 26 is illustrated by illustrating an ion beam B4 in scan end positions. The ion beam B is configured to be overscanned beyond the side cups 40R and 40L arranged at the left and right of the mechanical scanner 44 and the position where the center cup 42 movable in the X direction is arranged. While FIG. 3 illustrates the state of scanning of the horizontally long ion beam B, the shape of the ion beam B may be vertically long or nearly circular.

Figure 4:
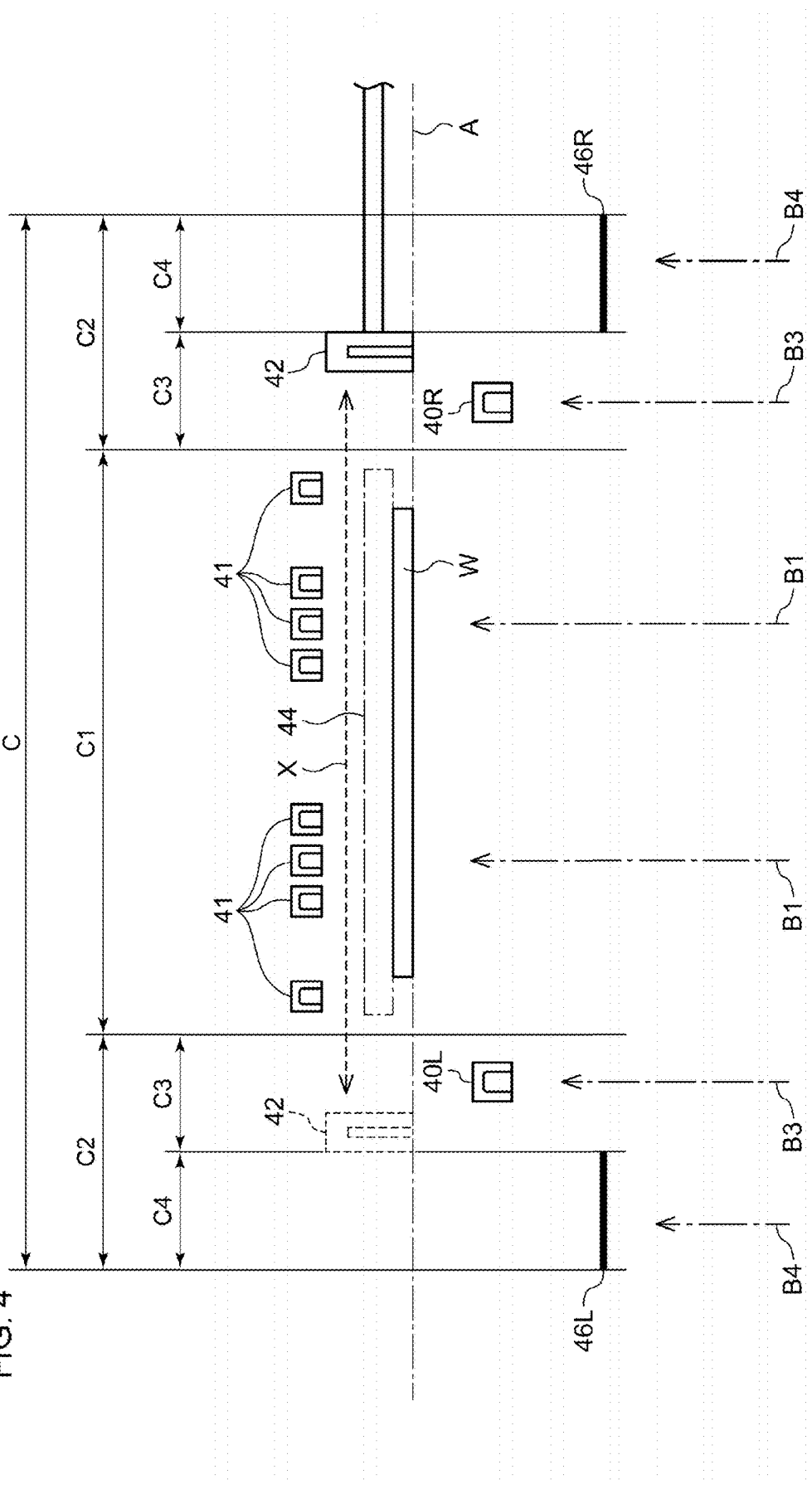
FIG. 4 is a top view illustrating a scan range of an ion beam.

FIG. 4 is a diagram illustrating a scannable range C of the ion beam B and corresponds to the top view of FIG. 3. The scannable range C can be divided into two regions of an implantation region C1 and a non-implantation region C2. The implantation region C1 is the range where the wafer W is positioned and is a range on the inner side of the positions where the side cups 40R and 40L are disposed. Accordingly, the ion beam B1 traveling toward the implantation region C1 is incident onto the wafer W that reciprocates by the mechanical scanner 44, and contributes to ion implantation.

The non-implantation region C2 is a region positioned outside the implantation region C1 and is a region corresponding to the outside of the range where the wafer W is positioned. Accordingly, ion beams B3 and B4 traveling toward the non-implantation region C2 are not incident onto the wafer W that reciprocates by the mechanical scanner 44, and do not contribute to ion implantation.

The non-implantation region C2 includes a side measurement position C3 and a scan end position C4. The side measurement position C3 corresponds to the positions where the side cups 40R and 40L are disposed. The ion beam B3 traveling toward the side measurement position C3 is incident onto the side cups 40R and 40L. Thus, scanning the ion beam to the side measurement position C3 enables monitoring of the intensity of the beam current during the ion implantation process. The scan end position C4 corresponds to the positions where the protective plates 46R and 46L are disposed. Accordingly, the ion beam B4 traveling toward the scan end position C4 is incident onto the protective plates 46R and 46L. Thus, in the case of scanning the ion beam to the scan end position C4, apart in the implantation processing chamber 16 that is not intended to be irradiated can be prevented from being irradiated with the ion beam.

The center cup 42 is a movable beam current detector and thus, can measure the beam current intensity distribution in a position A corresponding to the wafer surface in the implantation region C1 and a part of the range of the non-implantation region C2 (for example, the range of the non-implantation region C2 except for the scan end position C4) as illustrated in FIG. 4. The position A corresponds to the same position as the wafer surface in the Z direction which is the traveling direction of the ion beam B. The beam current intensity distribution in the beam scan direction (X direction) on the wafer surface can be acquired by dividing the implantation region C1 into approximately 1,000 minute sections and measuring the intensity of the beam current per the minute section while moving the center cup 42 in the X direction.

Alternatively, the second beam measuring unit 50 may include a plurality of beam current detectors 41 downstream of the wafer W. The beam current detectors 41 are fixed in the same manner as the side cups 40R and 40L. The beam current detectors 41 are arranged in the X direction and can measure the beam current intensity distribution in the respective X positions thereof. The beam current detectors 41 may be densely arranged in the X positions in a transitional implantation region (described in detail below) and sparsely arranged in other regions. The beam current detectors 41 desirably have a measurement position precision of less than or equal to 30 mm in the X direction.

The transitional implantation region means a region in which relatively low precision of the dose amount is required in the target two-dimensional dose amount distribution. In uniform implantation high implantation precision is required on the entire wafer. Meanwhile, in non-uniform implantation, (1) high implantation precision may be required on the entire wafer, and (2) implantation precision may be required in only a limited region in the wafer. For example, consider a requirement that a region within 100 mm from the wafer center is implanted with a reference dose amount and that a region outside 120 mm from the wafer center is implanted with 10% more of the reference dose amount. In this case, the dose amount in the region between 100 mm and 120 mm from the wafer center is considered as a transitional implantation region, and the dose amount is not particularly required to be precise and may be expected to be approximately between the reference dose amount and 110% of the reference dose amount. Accordingly, determination of a proper dose amount in non-uniform implantation may require to use the same method as in typical implantation in the case of (1) or may be performed except for the predetermined transitional implantation region in the case of (2). The length of the transitional implantation region is typically set to 5 mm to 30 mm. The length of the transitional implantation region is consistent with the position precision (less than or equal to 30 mm) of the beam current measurement.

Figure 5:
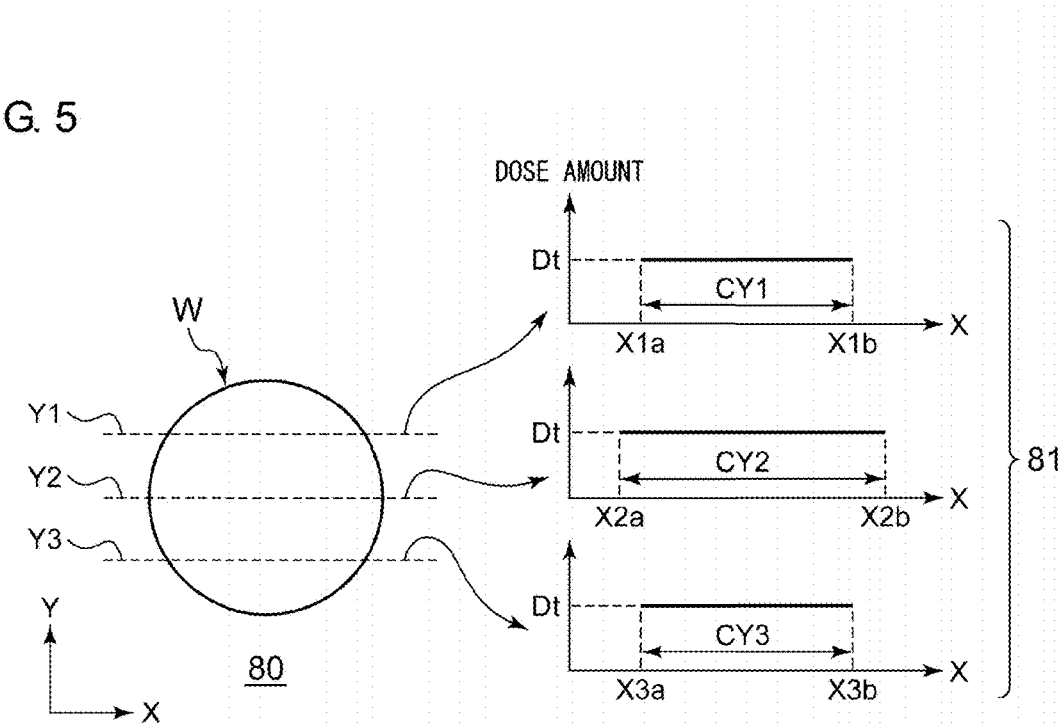
FIG. 5 is a diagram illustrating a target two-dimensional dose amount distribution on the wafer.
Figure 6:
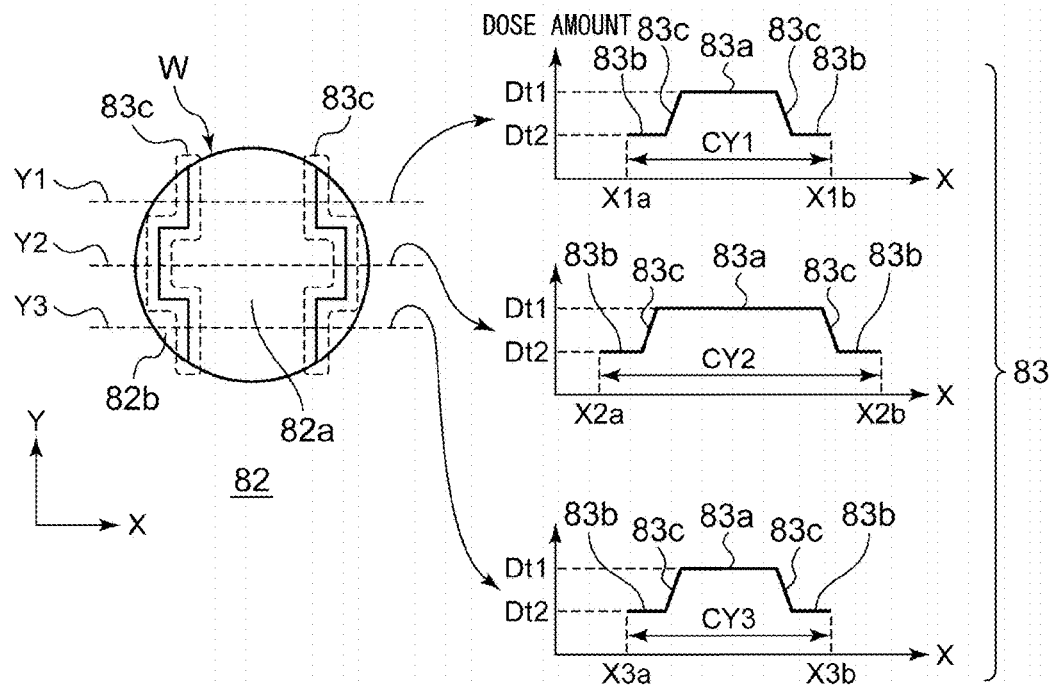
FIG. 6 is a diagram illustrating a target two-dimensional dose amount distribution on the wafer.
Figure 7:
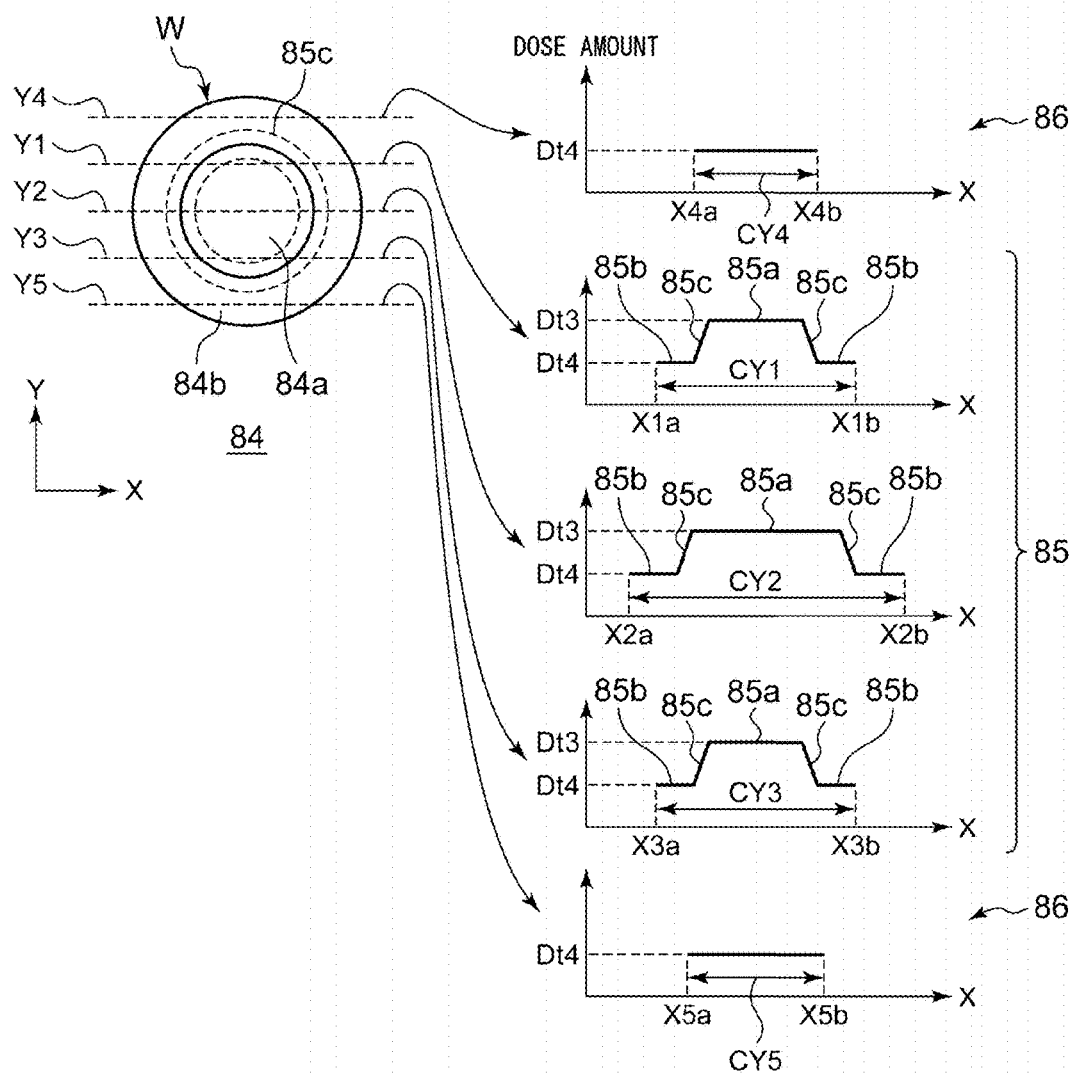
FIG. 7 is a diagram illustrating a target two-dimensional dose amount distribution on the wafer.

FIG. 5, FIG. 6, and FIG. 7 illustrate target two-dimensional dose amount distributions on the wafer W. FIG. 5 illustrates a target two-dimensional uniform dose amount distribution 80. FIG. 6 illustrates a target two-dimensional non-uniform dose amount distribution 82. FIG. 7 illustrates another target two-dimensional non-uniform dose amount distribution 84. As described above, the X direction represents the beam scan direction, and the Y direction represents the mechanical scan direction.

Each of FIG. 5, FIG. 6, and FIG. 7 also illustrates target one-dimensional dose amount distributions in the X direction in three Y positions Y1, Y2, and Y3. In addition, FIG. 7 illustrates target one-dimensional dose amount distributions in the X direction in Y positions Y4 and Y5. The X positions of both wafer ends in each of the Y positions Y1, Y2, Y3, Y4, and Y5 are represented as (X1$a$, X1$b$), (X2$a$, X2$b$), (X3$a$, X3$b$), (X4$a$, X4$b$), and (X5$a$, X5$b$). Each of scan ranges CY1, CY2, CY3, CY4, and CY5 in the Y positions Y1, Y2, Y3, Y4, and Y5 is defined by the X positions of both wafer ends.

The target dose amount distributions are for illustrative purposes for understanding, and no limitation to a specific illustrated distribution is intended.

As illustrated in FIG. 5, the target two-dimensional uniform dose amount distribution 80 has a uniform target dose amount Dt on the entire wafer surface. The target two-dimensional uniform dose amount distribution 80 includes a plurality of target one-dimensional uniform dose amount distributions 81 formed in different Y positions. Each target one-dimensional uniform dose amount distribution 81 is a dose amount distribution in the X direction. Generally, the target dose amount Dt in uniform implantation is to be precisely realized. Thus, each target one-dimensional uniform dose amount distribution 81 as a whole is a precise implantation region and does not have a transitional implantation region.

The target two-dimensional non-uniform dose amount distribution 82 illustrated in FIG. 6 has a first target dose amount Dt1 in a central region 82$a$ and a second target dose amount Dt2 different from the first target dose amount Dt1 in an outside region 82$b$. The first target dose amount Dt1 is greater than the second target dose amount Dt2. The target two-dimensional non-uniform dose amount distribution 82 includes a plurality of target one-dimensional non-uniform dose amount distributions 83 formed in different Y positions. Each target one-dimensional non-uniform dose amount distribution 83 is a dose amount distribution in the X direction.

Note that each target one-dimensional non-uniform dose amount distribution 83 has a first precise implantation region 83$a$, a second precise implantation region 83$b$, and a transitional implantation region 83$c$. The first precise implantation region 83$a$ is set to have the first target dose amount Dt1, and the second precise implantation region 83$b$ is set to have the second target dose amount Dt2. The first precise implantation region 83$a$ and the second precise implantation region 83$b$ are adjacent to each other in the X direction with the transitional implantation region 83$c$ interposed therebetween.

The target two-dimensional non-uniform dose amount distribution 82 includes one group of the target one-dimensional non-uniform dose amount distributions 83 lined up in the Y direction. Each target one-dimensional non-uniform dose amount distribution 83 has the transitional implantation region 83$c$. The central region 82$a$ is formed to have three rectangular parts lined up in the Y direction. Thus, the transitional implantation regions 83$c$ are connected in a polygonal line shape in the one group of target one-dimensional non-uniform dose amount distributions 83.

The other target two-dimensional non-uniform dose amount distribution 84 illustrated in FIG. 7 has a third target dose amount Dt3 in a central region 84$a$ and a fourth target dose amount Dt4 different from the third target dose amount Dt3 in an outer circumferential region 84$b$. The third target dose amount Dt3 is greater than the fourth target dose amount Dt4. The target two-dimensional non-uniform dose amount distribution 84 includes a plurality of target one-dimensional non-uniform dose amount distributions 85 formed in different Y positions.

Each target one-dimensional non-uniform dose amount distribution 85 has a third precise implantation region 85$a$, a fourth precise implantation region 85$b$, and a transitional implantation region 85$c$. The third precise implantation region 85$a$ is set to have the third target dose amount Dt3, and the fourth precise implantation region 85$b$ is set to have the fourth target dose amount Dt4. The third precise implantation region 85$a$ and the fourth precise implantation region 85b are adjacent to each other in the X direction with the transitional implantation region 85c interposed therebetween.

The target two-dimensional non-uniform dose amount distribution 84 includes one group of the target one-dimensional non-uniform dose amount distributions 85 lined up in the Y direction. Each target one-dimensional non-uniform dose amount distribution 85 has the transitional implantation region 85c. The central region 84a has a circular shape. Thus, the transitional implantation regions 85c are connected in an arc shape in the one group of target one-dimensional non-uniform dose amount distributions 85.

The transitional implantation regions 83c and 85c correspond to the boundaries of two precise implantation regions and thus, may be allowed to have lower implantation precision than the precise implantation regions. The lengths of the transitional implantation regions 83c and 85c in the X direction are, for example, greater than or equal to 5 mm and less than or equal to 30 mm.

The target two-dimensional non-uniform dose amount distribution 84 includes a plurality of target one-dimensional uniform dose amount distributions 86 formed in different Y positions. Each target one-dimensional uniform dose amount distribution 86 has the fourth target dose amount Dt4. The target two-dimensional non-uniform dose amount distribution 84 may include both a non-uniform one-dimensional dose amount distribution and a uniform one-dimensional dose amount distribution. Depending on the shape of the target two-dimensional non-uniform dose amount distribution, the target two-dimensional non-uniform dose amount distribution may include at least one target one-dimensional non-uniform dose amount distribution and at least one target one-dimensional uniform dose amount distribution.

In the present specification, a target one-dimensional (uniform or non-uniform) dose amount distribution may be referred to as a target dose amount distribution for simplification. A one-dimensional beam current intensity distribution described below may be simply referred to as a beam current intensity distribution.

Figure 8A:
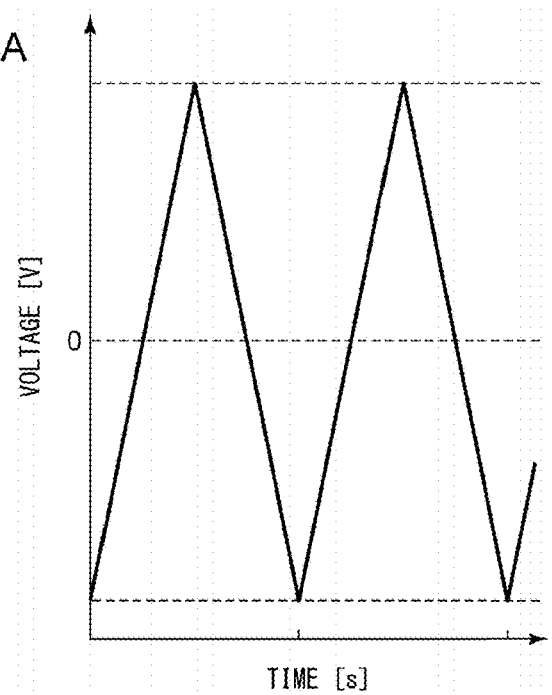
FIG. 8A and FIG. 8B are diagrams illustrating a scan waveform for controlling a beam scanner.
Figure 8B:
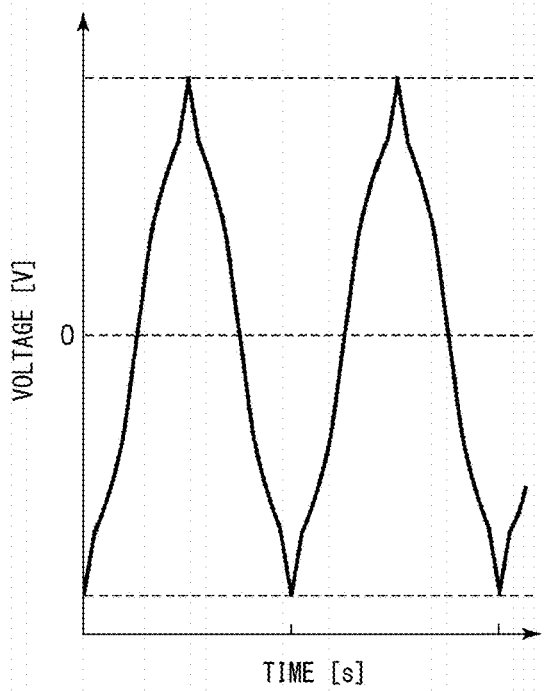

FIG. 8A and FIG. 8B illustrate scan waveforms that control the beam scanner 26. A scan waveform provides a scan speed distribution and a scan cycle of a reciprocating beam scan. Since the beam scanner 26 uses an electric field, the scan waveform corresponds to a scan voltage waveform applied to the beam scanner 26, that is, a waveform indicating a change in time of a difference between electrical potentials of both electrodes of the scanner electrodes 28.

The scan waveform illustrated in FIG. 8A is a triangular wave that linearly changes with respect to time. Such a scan waveform is often used as an initial value. Since the scan voltage linearly changes with respect to time, the scan speed is constant in the scan range.

Using a scan waveform of a linear triangular wave seems to achieve immediate acquisition of the target two-dimensional uniform dose amount distribution 80. However, in actuality, the acquisition is not easy because of various factors. Therefore, generally, the scan waveform is corrected to acquire the target two-dimensional uniform dose amount distribution 80.

The dose amount distribution on the wafer W is acquired by integrating the beam current intensity distribution on the wafer W with respect to time. The beam current intensity distribution is related to the dose amount distribution. In addition, the intensity of the beam current is low in a place where the scan speed is high. Conversely, the intensity of the beam current is high in a place where the scan speed is low.

Thus, the measured beam current intensity distribution can be approximated to a target beam current intensity distribution related to the target dose amount distribution by correcting the scan waveform. The scan waveform is corrected to increase the scan speed in a region where the measured intensity of the beam current is higher than the target intensity of the beam current. Conversely, the scan waveform is corrected to decrease the scan speed in a region where the measured intensity of the beam current is lower than the target intensity of the beam current. The measured beam current intensity distribution can be sufficiently approximated to (ideally, matched to) the target beam current intensity distribution by repeating correction of the scan waveform and measurement of the beam current intensity distribution. By doing so, the measured beam current intensity distribution can be caused to fit the target dose amount distribution.

FIG. 8B illustrates the corrected scan waveform. Unlike the initial scan waveform in FIG. 8A, the scan waveform in FIG. 8B is understood to have different inclinations of the scan voltage (that is, different scan speeds) in a part of one cycle and another part thereof.

Figure 9:
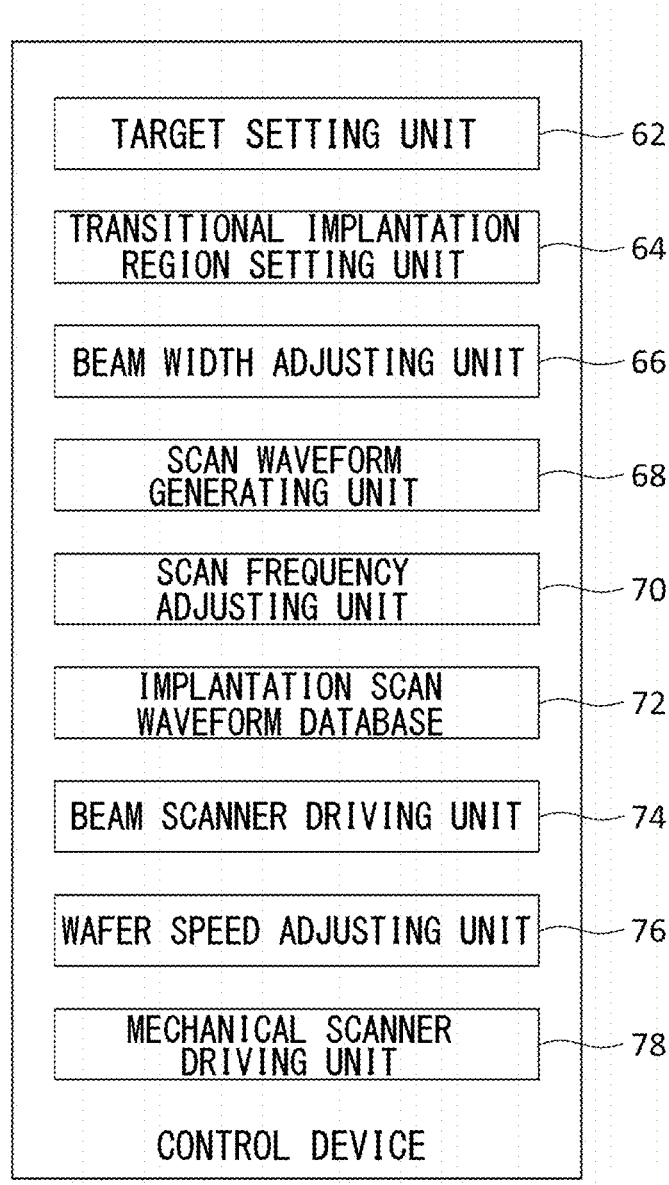
FIG. 9 is a block diagram schematically illustrating a control device according to the embodiment.

FIG. 9 is a block diagram schematically illustrating the control device 60 according to the embodiment. Each block in the block diagram of the present specification can be realized by a hardware configuration such as a CPU and a memory of a computer, an electronic device, a circuit, or a mechanical device or by a software configuration such as a computer program or the like. The function blocks illustrated here are realized by cooperation of a hardware configuration and a software configuration. Accordingly, those skilled in the art may understand that the function blocks can be realized in various forms by combinations of hardware and software.

The control device 60 includes a target setting unit 62, a transitional implantation region setting unit 64, a beam width adjusting unit 66, a scan waveform generating unit 68, a scan frequency adjusting unit 70, an implantation scan waveform database 72, a beam scanner driving unit 74, a wafer speed adjusting unit 76, and a mechanical scanner driving unit 78.

The target setting unit 62 is configured to convert the target two-dimensional non-uniform dose amount distribution into a plurality of target dose amount distributions formed in different positions in the mechanical scan direction. Each target dose amount distribution is a dose amount distribution in the beam scan direction. The transitional implantation region setting unit 64 is configured to set a transitional implantation region in each target dose amount distribution. The beam width adjusting unit 66 is configured to control at least one beamline configuration element in such a manner that the beam width is shorter than the length of the transitional implantation region in the beam scan direction.

The scan waveform generating unit 68 is configured to generate an implantation scan waveform that fits each target dose amount distribution, based on the measurement result of the second beam measuring unit 50. The scan waveform generating unit 68 repeats, until a fitting measured beam current intensity distribution is found, generation or correction of the scan waveform in a predetermined procedure and determination as to whether or not the measured beam current intensity distribution measured by the second beam measuring unit 50 by using the scan waveform fits the target non-uniform dose amount distribution. The generated scan waveform is stored in the implantation scan waveform database 72.

The scan waveform generating unit 68 also generates the scan waveform by performing a predetermined calculation process for the scan waveform stored in the implantation scan waveform database 72. For example, a non-uniform implantation scan waveform is generated by performing a calculation process in accordance with the target non-uniform dose amount distribution for the uniform implantation scan waveform. Specifically, a calculation process that uses an inversely proportional relationship between the target non-uniform dose amount distribution and a beam scan speed distribution is performed.

The scan waveform generating unit 68 generates a scan waveform that has a frequency determined by the scan frequency adjusting unit 70 described below. The scan waveform generating unit 68 expands or contracts the scan waveform in a time axis direction, thereby causing the scan waveform to have the frequency determined by the scan frequency adjusting unit 70. That is, a scan waveform having a different frequency is generated by changing only the average speed of the beam scan without changing the shape of the beam scan speed distribution corresponding to a certain scan waveform.

The scan frequency adjusting unit 70 determines the frequency of the scan waveform in accordance with the target two-dimensional dose amount distribution. The scan frequency adjusting unit 70 calculates an "upper limit scan frequency" as the frequency of the scan waveform in the case where the maximum change rate included in the scan waveform is adjusted to match a predetermined upper limit change rate. The upper limit change rate indicates the upper limit value of a change in time of the scan waveform available for driving by the beam scanner driving unit 74 and corresponds to the maximum scan speed of the beam scan realizable by the beam scanner 26. A scan waveform that exceeds the upper limit change rate is unavailable for driving. Thus, the "upper limit scan frequency" is calculated as a frequency corresponding to the upper limit change rate.

The scan frequency adjusting unit 70, for example, calculates an upper limit scan frequency $f_B$ from an upper limit change rate $v_{th}$ described above by a general formula $f_B = f \cdot v_{th}/v_{max}$ in the case where the scan waveform that realizes the target dose amount distribution has a frequency $f$ and a maximum change rate $v_{max}$. In the case where a plurality of target dose amount distributions is set by the target setting unit 62, the maximum change rate of each of the plurality of scan waveforms respectively corresponding to the plurality of target dose amount distributions is set not to exceed the predetermined upper limit change rate. The scan frequency adjusting unit 70, for example, calculates the individual upper limit scan frequencies of the plurality of scan waveforms and sets the minimum value of the plurality of individual upper limit scan frequencies as the upper limit scan frequency $f_B$.

The scan frequency adjusting unit 70 may calculate the upper limit scan frequency $f_B$ by using another method. The scan frequency adjusting unit 70 may calculate the upper limit scan frequency $f_B$ by using the fact that a target one-dimensional dose amount distribution $\alpha(x)$ set by the target setting unit 62 and a scan speed distribution $S(x)$ of a one-way beam scan in accordance with the scan waveform have an inversely proportional relationship. A cycle T (=1/f) of a reciprocating beam scan can be represented as $T = 2\int dx/S(x)$ by using the scan speed distribution $S(x)$. The integration range is the scan range of the reciprocating beam scan.

The relationship between the target one-dimensional dose amount distribution $\alpha(x)$ and the scan speed distribution $S(x)$ can be represented as $k \cdot \alpha(x) = 1/S(x)$ by introducing a proportionality constant k. The cycle T of the reciprocating beam scan can be represented as $T = 2k\int \alpha(x)dx$ by using the dose amount distribution $\alpha(x)$. As understood from this general formula, the cycle T (that is, the scan frequency f) can be adjusted by adjusting the proportionality constant k.

Consider a proportionality constant $k_B$ in the case where the scan frequency f is equal to the upper limit scan frequency $f_B$. In a position x where the scan speed has a maximum value $S_{max}$ in the scan speed distribution $S(x)$, the dose amount of the dose amount distribution $\alpha(x)$ has a minimum value $\alpha_{min}$, and a relational expression $k \cdot \alpha_{min} = 1/S_{max}$ is established. The frequency of the scan waveform is equal to the upper limit scan frequency $f_B$ in the case where the maximum value $S_{max}$ of the scan speed is equal to a maximum scan speed $S_{th}$ realizable by the beam scanner 26. Thus, the proportionality constant $k_B$ in this case can be represented as $k_B = 1/(\alpha_{min} \cdot S_{th})$. The upper limit scan frequency $f_B$ can be represented as $f_B = \alpha_{min} \cdot S_{th}/2\int \alpha(x)dx$ by substituting the proportionality constant $k_B$ in the above general formula. From this general formula, the upper limit scan frequency $f_B$ can be calculated from the target one-dimensional dose amount distribution $\alpha(x)$ and the maximum scan speed $S_{th}$ of the beam scanner 26.

The scan frequency adjusting unit 70 determines a scan frequency $f_C$ used in non-uniform implantation within a range between the calculated upper limit scan frequency $f_B$ and a lower limit scan frequency $f_A$ set in advance. The lower limit frequency $f_A$ set in advance is a frequency that is set from the viewpoint of wafer damage and uneven implantation, and a side effect of wafer damage or uneven implantation may be generated in the case where a scan frequency lower than $f_A$ is set. The lower limit frequency $f_A$ may be experimentally determined based on a relationship between the amount of damage induced to the wafer by beam irradiation and the frequency of the reciprocating beam scan or may be experimentally determined based on a relationship between a difference of the dose amount distribution realized on the wafer by beam irradiation from the target two-dimensional dose amount distribution and the frequency of the reciprocating beam scan.

The scan frequency adjusting unit 70 may determine the calculated upper limit scan frequency $f_B$ as the scan frequency $f_C$ or may determine any of values set in a stepwise manner between the lower limit scan frequency $f_A$ and the upper limit scan frequency $f_B$ as the scan frequency $f_C$. Considering influence of wafer damage and uneven implantation, the determined scan frequency $f_C$ may preferably have the highest value, that is, a value near the upper limit scan frequency $f_B$. In the case where, for example, the amount of the wafer damage is desirably increased to a certain extent, a value near the lower limit scan frequency $f_A$ may be determined as the scan frequency $f_C$, or the lower limit scan frequency $f_A$ may be determined as the scan frequency $f_C$. In the case where the calculated upper limit scan frequency $f_B$ is below the lower limit scan frequency $f_A$, the scan frequency adjusting unit 70 does not determine the scan frequency $f_C$ and notifies a user that the scan frequency $f_C$ cannot be determined.

The implantation scan waveform database 72 is configured to store the implantation scan waveform generated by the scan waveform generating unit 68.

The beam scanner driving unit 74 is configured to acquire scan waveforms respectively corresponding to the plurality of target dose amount distributions from the implantation scan waveform database 72. The beam scanner driving unit 74 is configured to select any of the acquired scan waveforms in accordance with the position of the substrate in the mechanical scan direction and drive the beam scanner 26 by using the selected scan waveform. The beam scanner driving unit 74 realizes different dose amount distributions per implantation region set on the wafer surface by switching the selected scan waveform in accordance with the position of the substrate in the mechanical scan direction.

The wafer speed adjusting unit 76 calculates a wafer speed coefficient that is used in adjustment of the wafer speed in the mechanical scan direction. In the case where a plurality of target dose amount distributions is set by the target setting unit 62, the wafer speed adjusting unit 76 calculates a plurality of wafer speed coefficients that respectively corresponds to the plurality of target dose amount distributions. Each of the plurality of wafer speed coefficients is selected in accordance with the position of the substrate in the mechanical scan direction and is set to control the dose amount distribution in the mechanical scan direction.

In the case where, for example, a plurality of regions having the same target dose amount is set in different positions in the mechanical scan direction, the wafer speed adjusting unit 76 calculates the wafer speed coefficient in such a manner that the product of the beam scan speed and the mechanical scan speed has a constant value in each region. The dose amount per unit time imparted to a minute region on the wafer surface is proportional to the product of the beam scan speed and the mechanical scan speed at the time of incidence of the ion beam onto the minute region. Thus, the same dose amount can be imparted to the micro regions in different positions by adjusting the wafer speed coefficient in such a manner that the product of the beam scan speed and the mechanical scan speed is constant.

The wafer speed adjusting unit 76 may calculate the wafer speed coefficient based on the intensity of the beam current monitored by the side cups 40R and 40L which are the beam current monitoring unit. The wafer speed adjusting unit 76 may adjust the wafer speed coefficient in such a manner that the ratio of the monitored intensity of the beam current and the mechanical scan speed is constant. The monitored intensity of the beam current is inversely proportional to the beam scan speed if the intensity of the beam current is constant without a scan. Accordingly, an adjustment equivalent to making the product of the beam scan speed and the mechanical scan speed constant can be performed by making the ratio of the monitored intensity of the beam current and the mechanical scan speed constant. In addition, a variation in dose amount due to a change in the intensity of the beam current without a scan can be corrected based on the monitored intensity of the beam current.

The mechanical scanner driving unit 78 is configured to drive the mechanical scanner 44 in accordance with the wafer speed coefficient calculated by the wafer speed adjusting unit 76. In the case where the wafer speed adjusting unit 76 calculates a plurality of wafer speed coefficients in accordance with the position of the substrate in the mechanical scan direction, the wafer speed coefficient corresponding to the position of the substrate is selected, and the mechanical scanner 44 is driven by using the selected wafer speed coefficient. In the case where the wafer speed adjusting unit 76 calculates the wafer speed coefficient based on the monitoring result of the beam current monitoring unit, the mechanical scanner 44 is driven in accordance with the calculated wafer speed coefficient. Accordingly, a desired dose amount distribution is realized in the mechanical scan direction. In such manner, the hybrid scan illustrated in FIG. 3 is realized.

Figure 10:
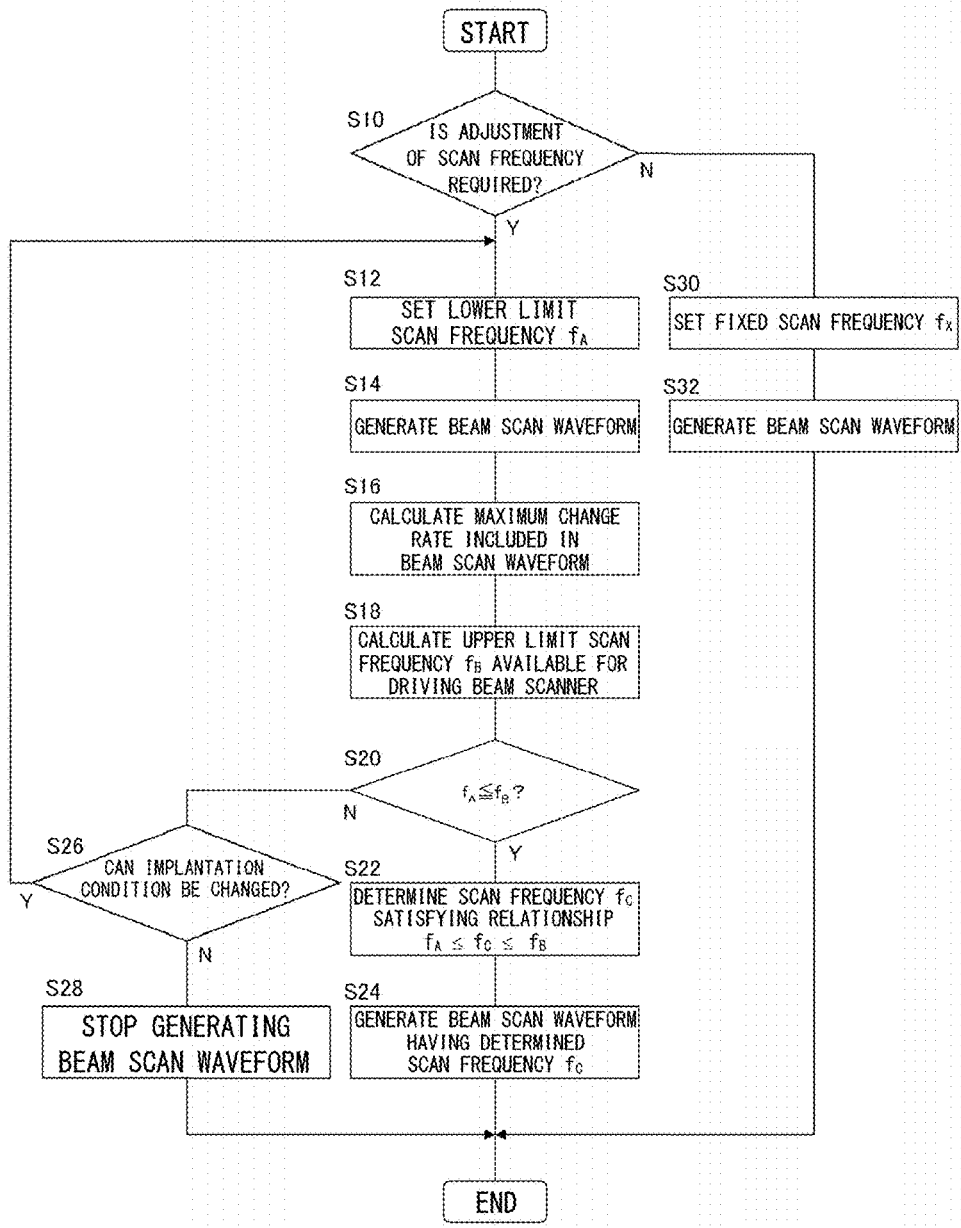
FIG. 10 is a flowchart illustrating a scan frequency adjusting method according to the embodiment.

FIG. 10 is a flowchart illustrating a scan frequency adjusting method according to the embodiment. The method is executed in a preparation stage of the ion implantation process.

First, if adjustment of the scan frequency is required (Y in S10), the control device 60 receives a setting of the lower limit scan frequency $f_A$ from the user (S12). The scan waveform generating unit 68 generates a beam scan waveform in accordance with the target two-dimensional dose amount distribution (S14). The scan frequency adjusting unit 70 calculates the maximum change rate $v_{max}$ included in the generated beam scan waveform (S16) and calculates the upper limit scan frequency $f_B$ available for driving the beam scanner 26 from the calculated maximum change rate $v_{max}$ (S18).

If the calculated upper limit scan frequency $f_B$ is greater than or equal to the lower limit scan frequency $f_A$ (Y in S20), the scan frequency adjusting unit 70 determines the scan frequency $f_C$ in a range of a frequency between greater than or equal to the lower limit scan frequency $f_A$ and less than or equal to the upper limit scan frequency $f_B$ (S22). The scan waveform generating unit 68 generates a beam scan waveform having the determined scan frequency $f_C$ (S24). In the case where generation of a plurality of beam scan waveforms is required in order to realize the target two-dimensional non-uniform dose amount distribution, the scan waveform generating unit 68 generates a plurality of scan waveforms in such a manner that each of the plurality of beam scan waveforms has the scan frequency $f_C$ in common.

If the calculated upper limit scan frequency $f_B$ is less than the lower limit scan frequency $f_A$ (N in S20), the scan frequency adjusting unit 70 notifies the user that the scan frequency $f_C$ cannot be determined, and the control device 60 causes the user to confirm whether or not an implantation condition can be changed (S26). If the implantation condition can be changed (Y in S26), the processes from S12 to S20 are repeated in accordance with the changed implantation condition. If the implantation condition cannot be changed (N in S26), the control device 60 stops generating the beam scan waveform (S28).

Adjustment of the scan frequency may not be required due to characteristics of the ion implantation process (N in S10). In this case, considering a plurality of beam scan waveforms required for acquisition of the settable target two-dimensional dose amount distribution, various target two-dimensional dose amount distributions can be acquired by setting a fixed scan frequency $f_X$ that is less than or equal to the upper limit scan frequency $f_B$. If adjustment of the scan frequency is not required (N in S10), the control device 60 sets the fixed scan frequency $f_X$ specified by the user (S30), and the scan waveform generating unit 68 generates a beam scan waveform having the set fixed scan frequency $f_X$ (S32).

Figure 11:
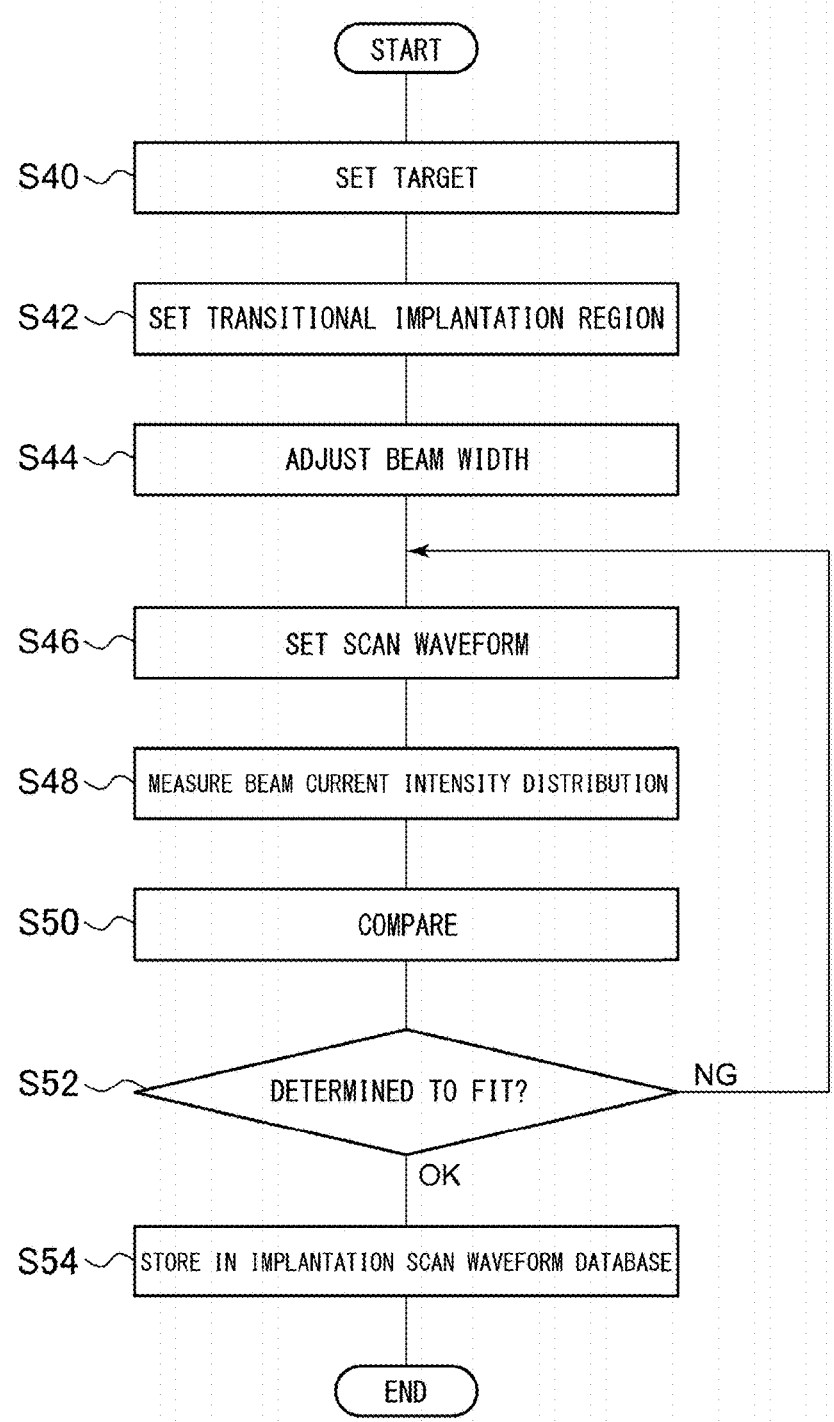
FIG. 11 is a flowchart illustrating an example of a scan waveform generation process in FIG. 10 in detail.
Figure 12:
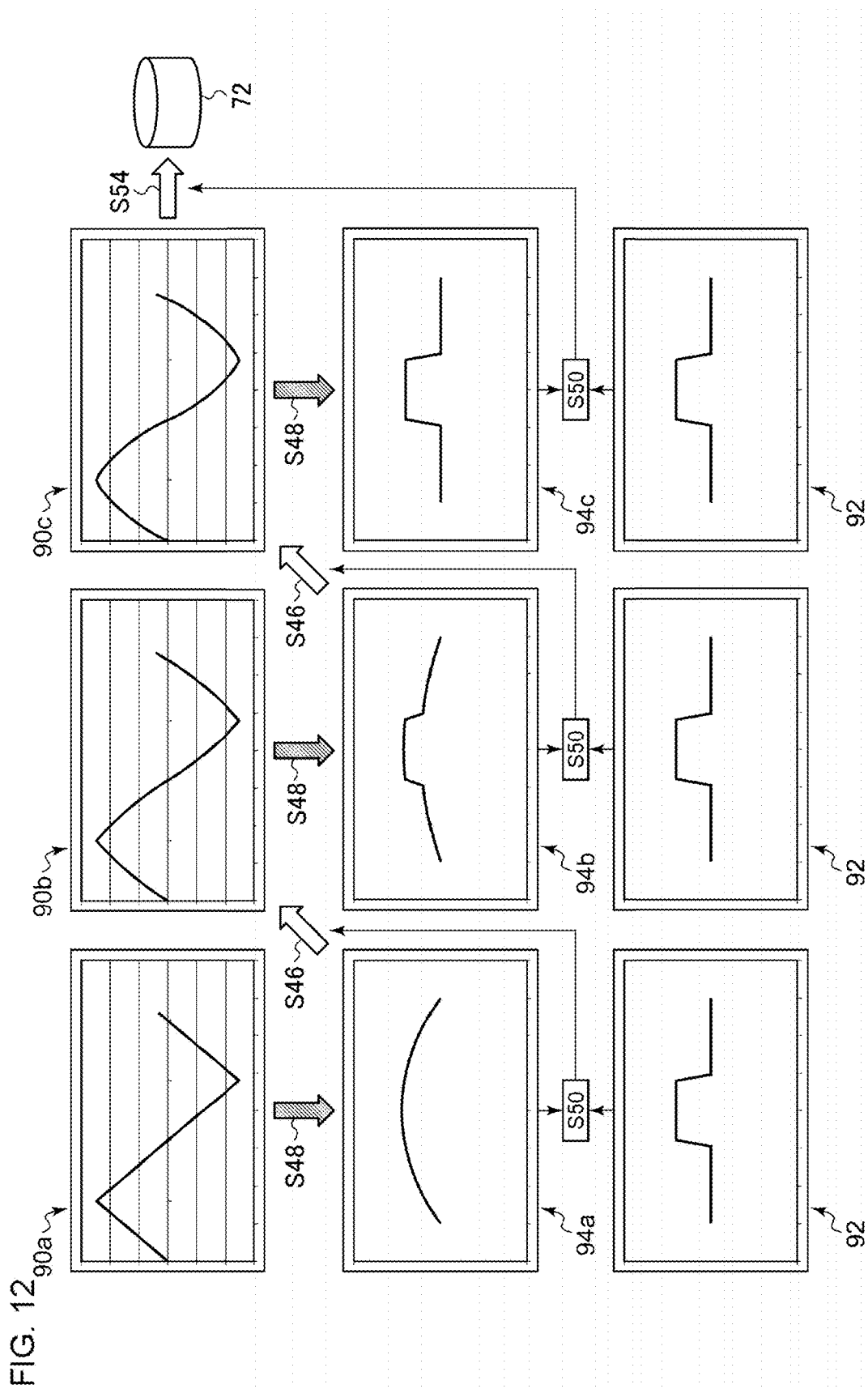
FIG. 12 is a diagram schematically illustrating a sequence of correction of a scan waveform by repetition.

Next, scan waveform generation processes in S14 and S32 in FIG. 10 will be described. FIG. 11 is a flowchart illustrating an example of the scan waveform generation process in FIG. 10 in detail. FIG. 12 schematically illustrates the state of correction of the scan waveform by using repetition method in FIG. 11. Note that a method for generating the beam scan waveform is not limited thereto and other methods may be used.

First, the target two-dimensional non-uniform dose amount distribution is input into the control device 60. The target setting unit 62 converts the target two-dimensional non-uniform dose amount distribution into a plurality of target (one-dimensional) dose amount distributions (S40). The transitional implantation region setting unit 64 sets a transitional implantation region for each of the plurality of target dose amount distributions (S42). The transitional implantation region setting unit 64 sets the transitional implantation region 83c between the first precise implantation region 83a and the second precise implantation region 83b for each target one-dimensional non-uniform dose amount distribution. The transitional implantation region setting unit 64 does not set a transitional implantation region for each target one-dimensional uniform dose amount distribution since the target one-dimensional uniform dose amount distribution does not have a transitional implantation region. The beam width adjusting unit 66, if necessary, controls at least one beamline configuration element in such a manner that the beam width is shorter than the length of the transitional implantation region in the beam scan direction (S44).

The scan waveform generating unit 68 sets a scan waveform (S46). Initially, the scan waveform generating unit 68 provides an initial value 90a of the scan waveform to the beam scanner driving unit 74. The initial value 90a of the scan waveform may be, for example, a scan waveform of a linear triangular wave illustrated in FIG. 8A or a scan waveform corrected for uniform implantation illustrated in FIG. 8B. The scan waveform may be stored in advance in the implantation scan waveform database 72, and the scan waveform generating unit 68 may read out the scan waveform from the implantation scan waveform database 72.

The scan waveform generating unit 68 may generate a beam scan waveform without using repetition method as illustrated in FIG. 11 and FIG. 12 described above. For example, a scan waveform may be determined by mathematical calculation based on a given target dose amount distribution. For example, a scan waveform corresponding to the target dose amount distribution may be generated by performing a calculation process, for the scan waveform corrected for uniform implantation illustrated in FIG. 8B, using an inversely proportional relationship between the target dose amount distribution and the beam scan speed distribution. That is, in the case of generating a beam scan waveform corresponding to the target dose amount distribution, the scan waveform may be determined based on a mathematical calculation process without measuring the beam current intensity distribution each time.

The beam scanner driving unit 74 drives the beam scanner 26 by using the scan waveform set by the scan waveform generating unit 68. The beam scanner 26 provides a reciprocating beam scan in the beam scan direction in accordance with the set scan waveform. The second beam measuring unit 50 measures the beam current intensity distribution in the beam scan direction downstream of the beam scanner 26 (S48).

The scan waveform generating unit 68 compares the target beam current intensity distribution related to the target non-uniform dose amount distribution with a measured beam current intensity distribution 94a (S50). The scan waveform generating unit 68 determines whether or not the measured beam current intensity distribution 94a fits a target non-uniform dose amount distribution 92, based on the comparison result (S52).

In the case where a transitional implantation region is set, the scan waveform generating unit 68 compares the target beam current intensity distribution with the measured beam current intensity distribution except for the transitional implantation region. That is, the target beam current intensity distribution and the measured beam current intensity are not compared with each other in the transitional implantation region. The scan waveform generating unit 68 compares the target beam current intensity distribution with the measured beam current intensity distribution only in a precise implantation region. The scan waveform generating unit 68 determines whether or not the measured beam current intensity distribution fits the target non-uniform dose amount distribution except for the transitional implantation region.

In the case where a transitional implantation region is not set, the scan waveform generating unit 68 compares the target beam current intensity distribution with the measured beam current intensity distribution in the scan range of the beam scanner 26 for ion implantation into the substrate surface. In such manner, the scan waveform generating unit 68 determines whether or not the measured beam current intensity distribution fits the target non-uniform dose amount distribution in the entire scan range.

The scan waveform generating unit 68 sets the scan waveform 90a again to another scan waveform 90b (S46) in the case where the measured beam current intensity distribution 94a does not fit the target non-uniform dose amount distribution 92 (NG in S52). The second beam measuring unit 50 measures a beam current intensity distribution 94b again by using the scan waveform 90b set again (S48). By doing so, the scan waveform generating unit 68 corrects the scan waveform 90a to the other scan waveform 90b and determines again whether or not the measured beam current intensity distribution 94b newly measured by using the corrected scan waveform 90b fits the target non-uniform dose amount distribution 92 (S52). Setting of the scan waveform, measurement of the beam current intensity distribution, and determination of fitness are repeated until a fitting measured beam current intensity distribution 94c is found.

In the case where the measured beam current intensity distribution 94c fits the target non-uniform dose amount distribution 92 (OK in S52), the scan waveform generating unit 68 employs a scan waveform 90c that is set when the measured beam current intensity distribution 94c its the target non-uniform dose amount distribution 92, as the implantation scan waveform for the target non-uniform dose amount distribution 92. That is, the scan waveform generating unit 68 associates the scan waveform 90c with the target non-uniform dose amount distribution 92. If necessary, the scan waveform generating unit 68 stores the scan waveform 90c associated with the target non-uniform dose amount distribution 92 in the implantation scan waveform database 72 (S54).

In such manner, a scan waveform for one target non-uniform dose amount distribution is determined. Scan waveforms for other target non-uniform dose amount distributions are determined in the same manner. That is, for each of the plurality of target non-uniform dose amount distributions, the scan waveform generating unit 68 determines whether or not the measured beam current intensity distribution measured by the second beam measuring unit 50 by using a given scan waveform fits the target non-uniform dose amount distribution and, in the case of fitting, stores the given scan waveform in the implantation scan waveform database 72 in association with the target non-uniform dose amount distribution.

The scan waveform generating unit 68 may execute normalization and uniformity evaluation instead of comparing the measured beam current intensity distribution with the target non-uniform dose amount distribution. The scan waveform generating unit 68 may determine whether or not the measured beam current intensity distribution fits the target non-uniform dose amount distribution by normalizing the measured beam current intensity distribution with the target beam current intensity distribution related to the target non-uniform dose amount distribution and evaluating uniformity of the normalized measured beam current intensity distribution.

The scan waveform generating unit 68, for the normalization, may calculate a beam current intensity distribution difference that is the difference between the measured beam current intensity distribution and the target beam current intensity distribution. The scan waveform generating unit 68 may evaluate uniformity of the beam current intensity distribution difference. In the case where the beam current intensity distribution difference falls in a predetermined threshold, the scan waveform generating unit 68 makes an evaluation that the beam current intensity distribution difference is uniform, and determines that the measured beam current intensity distribution fit the target non-uniform dose amount distribution. In the case where the beam current intensity distribution difference does not fall in the threshold, the scan waveform generating unit 68 makes an evaluation that the beam current intensity distribution difference is not uniform, and determines that the measured beam current intensity distribution does not fit the target non-uniform dose amount distribution.

The scan waveform generating unit 68, for the normalization, may calculate a beam current intensity distribution ratio that is the ratio of the measured beam current intensity distribution and the target beam current intensity distribution. The scan waveform generating unit 68 may evaluate uniformity of the beam current intensity distribution ratio. In the case where the beam current intensity distribution ratio falls in a predetermined threshold, the scan waveform generating unit 68 makes an evaluation that the beam current intensity distribution ratio is uniform, and determines that the measured beam current intensity distribution fit the target non-uniform dose amount. In the case where the beam current intensity distribution ratio does not fall in the threshold, the scan waveform generating unit 68 makes an evaluation that the beam current intensity distribution ratio is not uniform, and determines that the measured beam current intensity distribution does not fit the target non-uniform dose amount distribution.

The scan waveform generating unit 68 may normalize the measured beam current intensity distribution with the target beam current intensity distribution in the scan range of the beam scanner 26 for ion implantation into the substrate surface and evaluate uniformity of the normalized measured beam current intensity distribution. The scan waveform generating unit 68 may normalize the measured beam current intensity distribution with the target beam current intensity distribution except for the transitional implantation region set in advance and evaluate uniformity of the normalized measured beam current intensity distribution.

Hereinafter, a method for controlling a beam scan and a mechanical scan will be described with a specific example of the target two-dimensional dose amount distribution.

Figure 13:
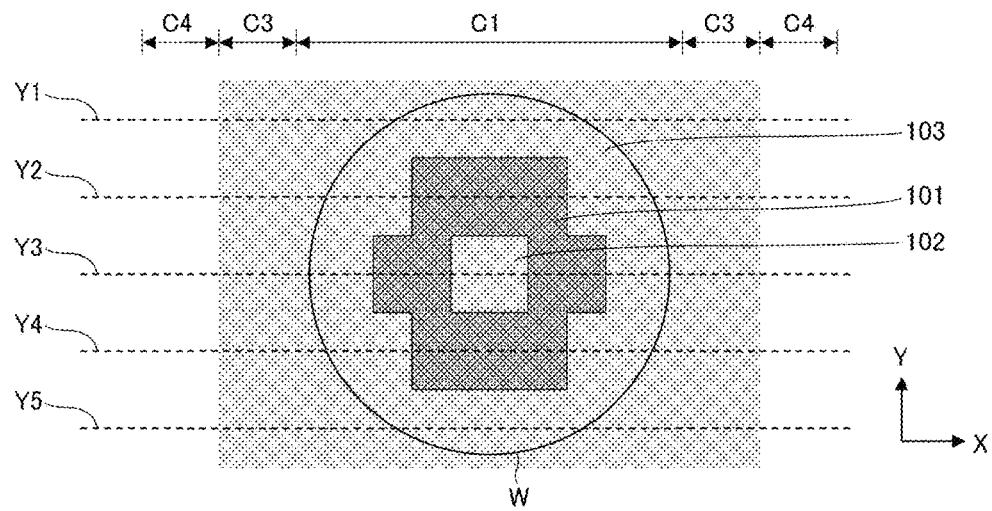
FIG. 13 is a diagram schematically illustrating one example of a target two-dimensional dose amount distribution.

FIG. 13 schematically illustrates one example of the target two-dimensional dose amount distribution and illustrates an example in which a donut-shaped high dose region 101 is set on the surface of the wafer W. Low dose regions 102 and 103 having a relatively low target dose amount are set inside and outside the high dose region 101. The outside low dose region 103 is set not only in the implantation region C1 where the wafer W is positioned, but also in the side measurement position C3 which is included in the non-implantation region C2. The outside low dose region 103 may be set also in the scan end position C4. In the example in FIG. 13, the target two-dimensional dose amount distribution is set in such a manner that the scan range in the beam scan direction (X direction) where the outside low dose region 103 is set is constant in different positions in the mechanical scan direction (Y direction). Though not illustrated in FIG. 13, the above transitional implantation region may be set in a part where the target dose amount is changed.

Figure 14:
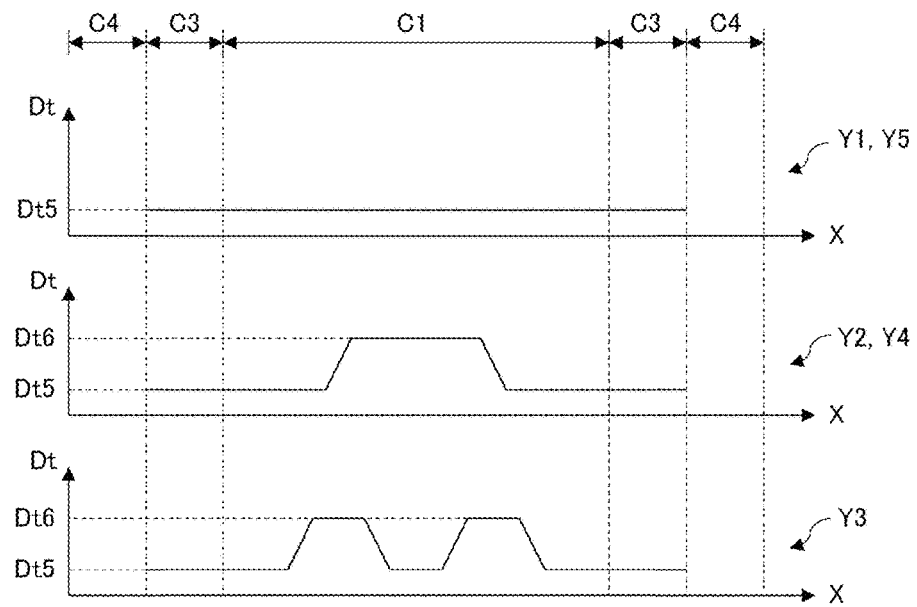
FIG. 14 is a diagram schematically illustrating one example of target one-dimensional dose amount distributions corresponding to the target two-dimensional dose amount distribution in FIG. 13.

FIG. 14 is a diagram schematically illustrating one example of target one-dimensional dose amount distributions corresponding to the target two-dimensional dose amount distribution in FIG. 13 and illustrates the target one-dimensional dose amount distributions in the different Y positions Y1 to Y5 in FIG. 13. The upper part of FIG. 14 illustrates a dose amount distribution in the Y positions Y1 and Y5. The entire dose amount distribution is set to have a fifth target dose amount Dt5. The middle part of FIG. 14 illustrates a dose amount distribution in the Y positions Y2 and Y4. In the dose amount distribution, the high dose region 101 is set to have a sixth target dose amount Dt6, and the low dose region 103 is set to have the fifth target dose amount Dt5. The lower part of FIG. 14 illustrates a dose amount distribution in the Y position Y3. In the dose amount distribution, the high dose region 101 is set to have the sixth target dose amount Dt6, and the low dose regions 102 and 103 are set to have the fifth target dose amount Dt5. As illustrated in FIG. 14, the sixth target dose amount Dt6 is greater than the fifth target dose amount Dt5.

Figure 15:
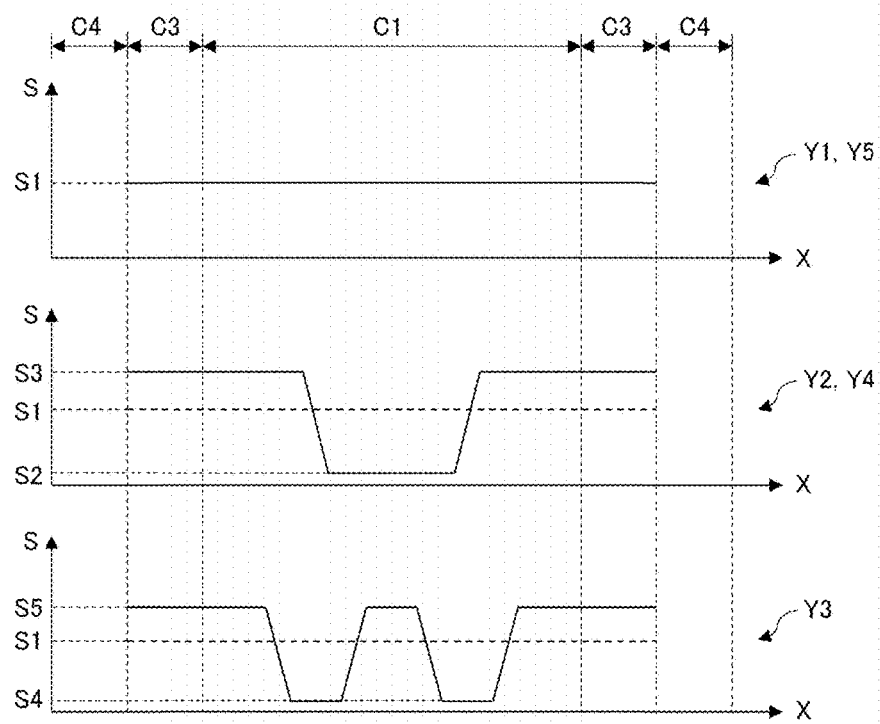
FIG. 15 is a diagram schematically illustrating one example of scan speed distributions corresponding to the target one-dimensional dose amount distributions in FIG. 14.

FIG. 15 is a diagram schematically illustrating one example of scan speed distributions corresponding to the target one-dimensional dose amount distributions in FIG. 14. The upper part of FIG. 15 illustrates a scan speed distribution in the Y positions Y1 and Y5. The entire scan speed distribution is set to have a first scan speed S1. This setting is for acquisition of a uniform beam current intensity distribution in the entire implantation region C1. While, in actuality, fine adjustment is applied to the scan speed distribution for correction of an optical aberration or the like of a beam scan system, FIG. 15 illustrates the scan speed distribution with such a correction factor ignored for easy understanding.

The middle part of FIG. 15 illustrates a scan speed distribution in the Y positions Y2 and Y4. In the scan speed distribution, the high dose region 101 is set to have a second scan speed S2, and the low dose region 103 is set to have a third scan speed S3. The ratio of the second scan speed S2 and the third scan speed S3 is equal to the ratio of the fifth target dose amount Dt5 and the sixth target dose amount Dt6. The average value of the scan speed distribution is illustrated by a dashed line in the graph. In the example in FIG. 15, the scan speed distribution is set in such a manner that the scan range and the scan frequency of the beam scan are constant in Y positions. Thus, the average value of the scan speed distribution equates to the first scan speed S1. Consequently, the second scan speed S2 is less than the first scan speed S1, and the third scan speed S3 is greater than the first scan speed S1. The third scan speed S3 is set to be less than or equal to the maximum value of the scan speed realizable by the beam scanner 26.

The lower part of FIG. 15 illustrates a scan speed distribution in the Y position Y3. In the scan speed distribution, the high dose region 101 is set to have a fourth scan speed S4, and the low dose regions 102 and 103 are set to have a fifth scan speed S5. The ratio of the fourth scan speed S4 and the fifth scan speed S5 is equal to the ratio of the fifth target dose amount Dt5 and the sixth target dose amount Dt6. The average value of the scan speed distribution illustrated by a dashed line equates to the first scan speed S1 for the same reason as described above. Meanwhile, the ranges where the fifth target dose amount Dt5 and the sixth target dose amount Dt6 are set are different from those in the Y positions Y2 and Y4. Thus, the values of the fourth scan speed S4 and the fifth scan speed S5 may be different from the second scan speed S2 and the third scan speed S3. The fifth scan speed S5 is set to be less than or equal to the maximum value of the scan speed realizable by the beam scanner 26.

As a result of setting the scan speed distributions in the different Y positions Y1 to Y5 as described above, different scan speed may be set in the positions of the wafer where the same target dose amount (for example, the fifth target dose amount Dt5) is to be. Specifically, the outside low dose region 103 has the first scan speed S1 in the Y positions Y1 and Y5, the third scan speed S3 in the Y positions Y2 and Y4, and the fifth scan speed S5 in the Y position Y3. The wafer speed in the mechanical scan direction (Y direction) is adjusted in order to impart the same target dose amount in the positions where different beam scan speeds are set. Specifically, the wafer speed in each of the Y positions Y1 to Y5 is adjusted in such a manner that the product of the beam scan speed and the wafer speed is constant. For example, given that the wafer speed coefficient in the Y positions Y1 and Y5 is equal to one, the wafer speed coefficient in the Y positions Y2 and Y4 is adjusted to S1/S3, and the wafer speed coefficient in the Y position Y3 is adjusted to S1/S5. Adjustment of the wafer speed coefficient may be based on the beam scan speeds in the different Y positions Y1 to Y5 or based on the measurement result for the intensity of the beam current in the side measurement position C3.

Figure 16:
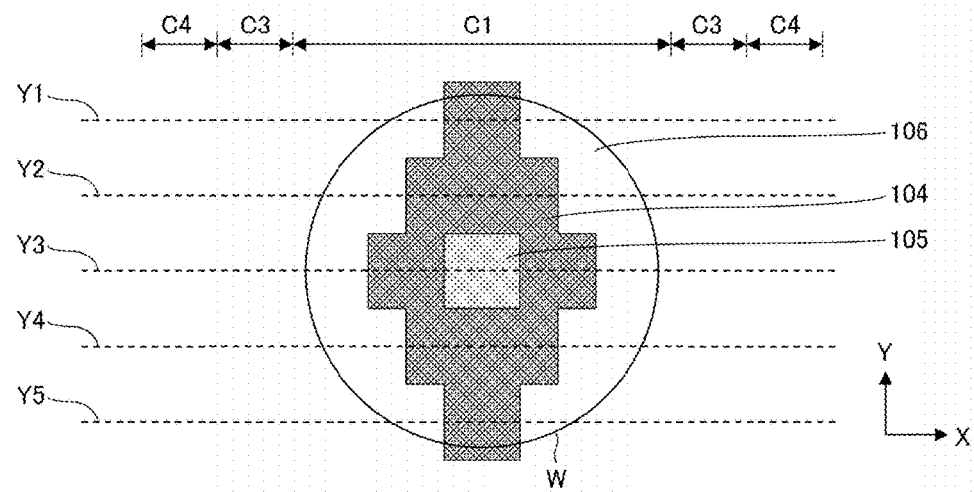
FIG. 16 is a diagram schematically illustrating another example of the target two-dimensional dose amount distribution.

FIG. 16 is a diagram schematically illustrating another example of the target two-dimensional dose amount distribution. A common characteristic between FIG. 16 and FIG. 13 is that a low dose region 105 is set inside a donut-shaped high dose region 104. A different characteristic between FIG. 16 and FIG. 13 is that a zero dose region 106 is set outside the high dose region 104 in FIG. 16. The zero dose region 106 is a region having a target dose amount equal to zero and is a non-implantation-target region that is not irradiated with the beam. In the example in FIG. 16, the target two-dimensional dose amount distribution is set in such a manner that the scan range in the X direction is narrower than the implantation region C1 and that the beam scan ranges are different in different Y positions.

Figure 17:
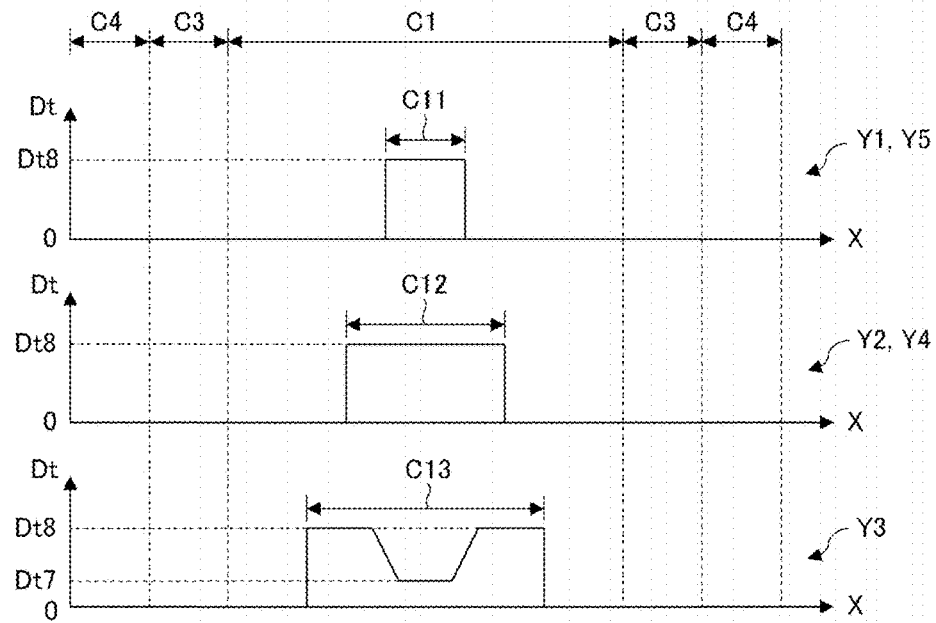
FIG. 17 is a diagram schematically illustrating one example of target one-dimensional dose amount distributions corresponding to the target two-dimensional dose amount distribution in FIG. 16.

FIG. 17 is a diagram schematically illustrating one example of target one-dimensional dose amount distributions corresponding to the target two-dimensional dose amount distribution in FIG. 16. The upper part of FIG. 17 illustrates a dose amount distribution in the Y positions Y1 and Y5. In the dose amount distribution, a first range C11 that is narrower than the implantation region C1 is set to have an eighth target dose amount Dt8, and the target dose amount outside the first range C11 is set to zero. The middle part of FIG. 17 illustrates a dose amount distribution in the Y positions Y2 and Y4. In the dose amount distribution, a second range C12 that is wider than the first range C11 is set to have the eighth target dose amount Dt8, and the target dose amount outside the second range C12 is set to zero. The lower part of FIG. 17 illustrates a dose amount distribution in the Y position Y3. In the dose amount distribution, a third range C13 that is wider than the second range C12 is set to have a seventh target dose amount Dt7 and the eighth target dose amount Dt8, and the target dose amount outside the third range C13 is set to zero.

Figure 18:
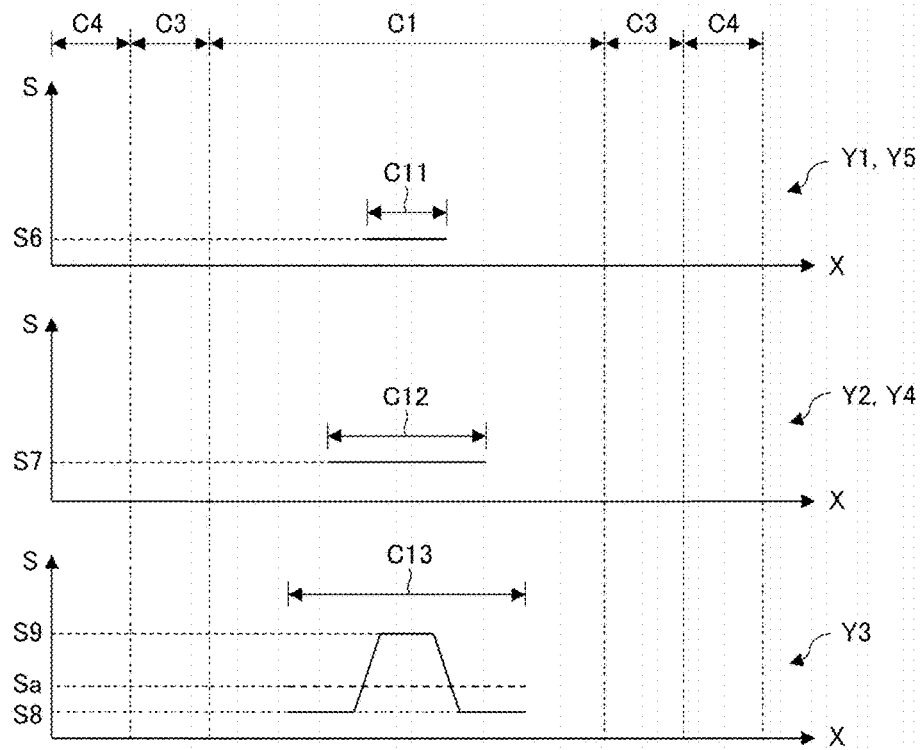
FIG. 18 is a diagram schematically illustrating one example of scan speed distributions corresponding to the target one-dimensional dose amount distribution in FIG. 17.

FIG. 18 is a diagram schematically illustrating one example of scan speed distributions corresponding to the target one-dimensional dose amount distributions in FIG. 17. The upper part of FIG. 18 illustrates a scan speed distribution in the Y positions Y1 and Y5. In the scan speed distribution, the first range C11 is set to have a sixth scan speed S6. The scan speed is not set outside the first range C11. The beam is reciprocatingly scanned within the first range C11. The middle part of FIG. 18 illustrates a scan speed distribution in the Y positions Y2 and Y4. In the scan speed distribution, the second range C12 is set to have a seventh scan speed S7. In the example in FIG. 18, the scan speed distribution is set in such a manner that the beam scan frequency is constant indifferent Y positions. Thus, the seventh scan speed S7 is set to have a greater value than the sixth scan speed S6. The reason is because the second range C12 which is scanned at the seventh scan speed S7 is wider than the first range C11 scanned at the sixth scan speed S6.

The lower part of FIG. 18 illustrates a scan speed distribution in the Y position Y3. In the scan speed distribution, the high dose region 104 is set to have an eighth scan speed S8, and the low dose region 105 is set to have a ninth scan speed S9. The ratio of the eighth scan speed S8 and the ninth scan speed S9 is equal to the ratio of the seventh target dose amount Dt7 and the eighth target dose amount Dt8. An average value Sa of the scan speed distribution illustrated by a dashed line is set to have a value greater than the seventh scan speed S7. The ninth scan speed S9 is set to be less than or equal to the maximum value of the scan speed realizable by the beam scanner 26.

The wafer speed in the mechanical scan direction in the plurality of Y positions Y1 to Y5 is set to have different values in accordance with the scan speed distribution in each of the Y positions Y1 to Y5 and is adjusted in such a manner that the product of the beam scan speed and the wafer speed has a constant value. For example, given that the wafer speed coefficient in the Y positions Y1 and Y5 is equal to one, the wafer speed coefficient in the Y positions Y2 and Y4 is adjusted to S6/S7, and the wafer speed coefficient in the Y position Y3 is adjusted to S6/S8. In the example in FIG. 18, the range of the reciprocating beam scan does not include the side measurement position C3. Thus, the intensity of the beam current cannot be measured during implantation into the wafer. Therefore, adjustment of the wafer speed coefficient is executed based on the beam scan speeds in the different Y positions Y1 to Y5.

Figure 19:
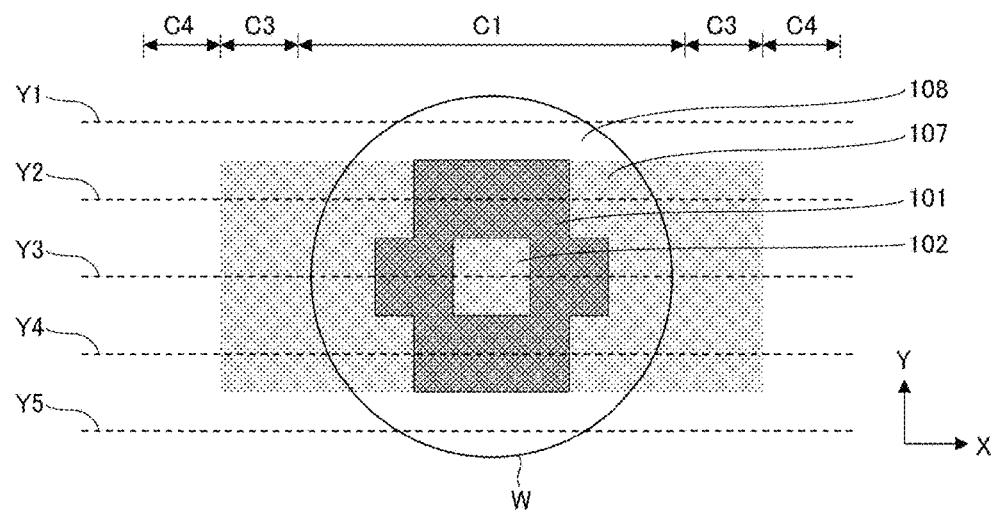
FIG. 19 is a diagram schematically illustrating still another example of the target two-dimensional dose amount distribution.

FIG. 19 is a diagram schematically illustrating still another example of the target two-dimensional dose amount distribution. A common characteristic between FIG. 19 and FIG. 13 is that the low dose region 102 is set inside the donut-shaped high dose region 101. A different characteristic between FIG. 19 and FIG. 13 is that a low dose region 107 and a zero dose region 108 are set outside the high dose region 101 in FIG. 19. The low dose region 107 is set to the range of the Y positions Y2 to Y4. The zero dose region 108 is set to the range of the Y positions Y1 and Y5. In the example in FIG. 19, a non-implantation-target regions are set at the upper end and the lower end of the wafer W.

In order to realize the dose amount distribution illustrated in FIG. 19, the ion beam recedes to the scan end position C4 in the Y positions Y1 and Y5. In this case, a beam scan waveform that has a constant value as time elapses is set, and the scan range in the beam scan direction does not include the implantation region C1. The upper end region and the lower end region of the wafer W may be excluded from an implantation target by restricting the scan range in the Y direction. That is, the mechanical scanner 44 may be driven in such a manner that the scan range in the mechanical scan direction is a range narrower than the wafer diameter.

As a modification example of the dose amount distribution illustrated in FIG. 19, a low dose region may be set in the range of the Y positions Y1 and Y5 instead of a zero dose region. The low dose region may have a target dose amount or different from the low dose region 107 set in the range of the Y positions Y2 to Y4.

While an embodiment of the invention is described with reference to the above embodiment, the embodiment of the invention is not limited to the above embodiment and includes an appropriate combination or substitution of the configurations of the embodiment. Appropriate changes in the order of combinations or processes in the embodiment or various modifications such as design changes may be carried out to the embodiment based on the knowledge of those skilled in the art. The embodiment to which such modifications are carried out may be included in the scope of the embodiment of the invention.

What is claimed is:

1. An ion implantation apparatus comprising:
    a beam scanner that provides a reciprocating beam scan in a beam scan direction in accordance with a scan waveform;
    a mechanical scanner that causes a wafer to reciprocate in a mechanical scan direction; and
    a control device that controls the beam scanner and the mechanical scanner to realize a target two-dimensional dose amount distribution on a surface of the wafer,
    wherein the control device includes
        a scan frequency adjusting unit that determines a frequency of the scan waveform in accordance with the target two-dimensional dose amount distribution, and
        a beam scanner driving unit that drives the beam scanner by using the scan waveform having the frequency determined by the scan frequency adjusting unit,
    wherein an upper limit change rate that is an upper limit value of a change in time of the scan waveform available for driving is determined in the beam scanner driving unit, and
    wherein the scan frequency adjusting unit determines the frequency of the scan waveform to be less than or equal to an upper limit scan frequency that is the frequency of the scan waveform in a case that a maximum change rate of the scan waveform for realizing the target two-dimensional dose amount distribution is adjusted to match the upper limit change rate.

2. The ion implantation apparatus according to claim 1, wherein the scan frequency adjusting unit determines the frequency of the scan waveform to be greater than or equal to a lower limit scan frequency that is determined based on a relationship between an amount of damage induced to the wafer by beam irradiation and a frequency of the reciprocating beam scan.

3. The ion implantation apparatus according to claim 1, wherein the scan frequency adjusting unit determines the frequency of the scan waveform to be greater than or equal to a lower limit scan frequency that is determined based on a relationship between a difference of a dose amount distribution realized on the wafer by beam irradiation from the target two-dimensional dose amount distribution and a frequency of the reciprocating beam scan.

4. The ion implantation apparatus according to claim 1, wherein the control device further includes a target setting unit that sets, based on the target two-dimensional dose amount distribution, a plurality of target dose amount distributions which is a dose amount distribution in the beam scan direction and respectively corresponds to different positions in the mechanical scan direction, and the beam scanner driving unit selects, in accordance with a position of the wafer in the mechanical scan direction, any of a plurality of scan waveforms that has the frequency determined by the scan frequency adjusting unit and respectively corresponds to the plurality of target dose amount distributions, and drives the beam scanner by using the selected scan waveform.

5. The ion implantation apparatus according to claim 4, wherein
    the scan frequency adjusting unit determines the frequency of the scan waveform in such a manner that each of maximum change rates of the plurality of scan waveforms does not exceed the upper limit change rate.

6. The ion implantation apparatus according to claim 5, wherein the scan frequency adjusting unit determines the frequency of the scan waveform in such a manner that each of the plurality of scan waveforms has a common scan frequency.

7. The ion implantation apparatus according to claim 4, further comprising:
    a beam current measuring unit that measures a beam current intensity distribution in the beam scan direction downstream of the beam scanner,
    wherein the control device further includes a scan waveform generating unit that generates, based on the measurement by the beam current measuring unit, a scan waveform for acquiring a desired beam current intensity distribution, and
    the scan waveform generating unit generates, by using a measurement result of the beam current measuring unit, a reference scan waveform for acquiring a uniform beam current intensity distribution in the beam scan direction and generates a scan waveform for realizing the target dose amount distribution by performing a predetermined calculation process for the generated reference scan waveform.

8. The ion implantation apparatus according to claim 4, further comprising:
    a beam current measuring unit that measures a beam current intensity distribution in the beam scan direction downstream of the beam scanner,
    wherein the control device further includes a scan waveform generating unit that generates, based on the measurement by the beam current measuring unit, a scan waveform for acquiring a desired beam current intensity distribution, and
    the scan waveform generating unit generates a scan waveform for realizing the target dose amount distribution by adjusting the scan waveform in such a manner that the beam current intensity distribution measured by the beam current measuring unit fits the target dose amount distribution.

9. The ion implantation apparatus according to claim 8, wherein at least one of the plurality of target dose amount distributions is a target non-uniform dose amount distribution that includes a first precise implantation region where a first target dose amount is set, a second precise implantation region which is adjacent to the first precise implantation region in the beam scan direction and where a second target dose amount is set, and a transitional implantation region set between the first precise implantation region and the second precise implantation region, and the scan waveform generating unit generates the scan waveform in such a manner that the beam current intensity distribution measured by the beam current measuring unit fits the target non-uniform dose amount distribution except for the transitional implantation region.

10. The ion implantation apparatus according to claim 4, wherein at least one of the plurality of scan waveforms is configured to have a different scan range in the beam scan direction from the other scan waveforms.

11. The ion implantation apparatus according to claim 4, wherein at least one of the plurality of scan waveforms is configured to have a scan range in the beam scan direction that is narrower than an implantation region in which the wafer is positioned.

12. The ion implantation apparatus according to claim 8, wherein the beam scanner is configured to provide the reciprocating beam scan across a range including an implantation region in which the wafer is positioned and a non-implantation region outside of the implantation region, the ion implantation apparatus further includes a beam current monitoring unit that monitors an intensity of a beam current in the non-implantation region during implantation into the wafer, and at least one of the plurality of scan waveforms is configured to include a scan range in the beam scan direction that includes the non-implantation region in order to enable monitoring of the intensity of the beam current during implantation into the wafer.

13. The ion implantation apparatus according to claim 12, wherein each of the plurality of scan waveforms is configured to have the same scan range in the beam scan direction.

14. The ion implantation apparatus according to claim 12, wherein the target two-dimensional dose amount distribution includes a region that is not to be an implantation target, and at least one of the plurality of scan waveforms is configured not to have a scan range that includes the implantation region in the beam scan direction.

15. The ion implantation apparatus according to claim 12, wherein the control device further includes a wafer speed adjusting unit that calculates, based on the intensity of the beam current monitored in the non-implantation region during implantation in the wafer, a wafer speed coefficient used in adjustment of a wafer speed in the mechanical scan direction, and a mechanical scanner driving unit that drives the mechanical scanner in accordance with the wafer speed coefficient calculated by the wafer speed adjusting unit.

16. The ion implantation apparatus according to claim 4, wherein the control device further includes a wafer speed adjusting unit that calculates, based on the plurality of scan waveforms, a plurality of wafer speed coefficients which are used in adjustment of a wafer speed in the mechanical scan direction and respectively corresponds to the plurality of target dose amount distributions, and a mechanical scanner driving unit that selects, in accordance with a position of the wafer in the mechanical scan direction, any of the plurality of wafer speed coefficients calculated by the wafer speed adjusting unit and drives the mechanical scanner in accordance with the selected wafer speed coefficient.

17. The ion implantation apparatus according to claim 1, wherein the target two-dimensional dose amount distribution includes a region that is not to be an implantation target, and the control device further includes a mechanical scanner driving unit that drives the mechanical scanner in such a manner that a scan range in the mechanical scan direction is a range narrower than a diameter of the wafer.

18. The ion implantation apparatus according to claim 1, wherein the beam scanner driving unit, in a case that the frequency is not required to be adjusted by the scan frequency adjusting unit, drives the beam scanner by using a scan waveform having a fixed scan frequency that is set in advance.

19. An ion implantation method using an ion implantation apparatus including a beam scanner that provides a reciprocating beam scan in a beam scan direction in accordance with a scan waveform, and a mechanical scanner that causes a wafer to reciprocate in a mechanical scan direction wherein an upper limit change rate that is an upper limit value of a change in time of the scan waveform available for driving is determined in the beam scanner, the method comprising:

determining a frequency of the scan waveform in accordance with a target two-dimensional dose amount distribution that is to be realized on a surface of the wafer; and driving the beam scanner in accordance with the scan waveform having the determined frequency, wherein the frequency of the scan waveform is determined to be less than or equal to an upper limit scan frequency that is the frequency of the scan waveform in a case that a maximum change rate of the scan waveform for realizing the target two-dimensional dose amount distribution is adjusted to match the upper limit change rate.

* * * * *